(12) United States Patent
Granek et al.

(10) Patent No.: US 10,731,268 B2
(45) Date of Patent: Aug. 4, 2020

(54) BOTTOM-UP METHOD FOR FORMING WIRE STRUCTURES UPON A SUBSTRATE

(71) Applicant: XTPL S.A., Wroclaw (PL)

(72) Inventors: Filip Granek, Wroclaw (PL); Zbigniew Rozynek, Bydgoszcz (PL)

(73) Assignee: XTPL S.A., Wroclaw (PL)

( * ) Notice: Subject to any disclaimer, the term of this patent is extended or adjusted under 35 U.S.C. 154(b) by 0 days.

(21) Appl. No.: 16/087,462

(22) PCT Filed: Mar. 21, 2017

(86) PCT No.: PCT/EP2017/056739
§ 371 (c)(1),
(2) Date: Sep. 21, 2018

(87) PCT Pub. No.: WO2017/162696
PCT Pub. Date: Sep. 28, 2017

(65) Prior Publication Data
US 2019/0106804 A1    Apr. 11, 2019

(30) Foreign Application Priority Data

Mar. 22, 2016   (GB) .................................. 1604818.3

(51) Int. Cl.
*C25D 13/12* (2006.01)
*C25D 13/22* (2006.01)
(Continued)

(52) U.S. Cl.
CPC ............ *C25D 13/12* (2013.01); *B82B 3/0004* (2013.01); *B82B 3/0052* (2013.01); *C25D 13/22* (2013.01);
(Continued)

(58) Field of Classification Search
CPC ...... C25D 13/12; C25D 13/22; B82B 3/0004; B82B 3/0052; H01L 21/02422;
(Continued)

(56) References Cited

U.S. PATENT DOCUMENTS 9,096,954 B2 *   8/2015   Isozaki .................... B01J 23/52
9,129,969 B2 *   9/2015   Busnaina .......... H01L 23/53257

FOREIGN PATENT DOCUMENTS

EP        1556737 A2      7/2005
WO     2010/028712 A1     3/2010

OTHER PUBLICATIONS

Liu Weiyu et al.; "AC electric field induced dielbectrophoretic assembly behavior of gold nanoparticles in wide frequency range"; Applied Surface Science, Elsevier, Amsterdam, NL; vol. 370; pp. 184-192, Date: Feb. 15, 2016.

* cited by examiner

*Primary Examiner* — Michael P Wieczorek
(74) *Attorney, Agent, or Firm* — Taft Stettinius & Hollister LLP; Ryan O. White

(57) ABSTRACT

A method is provided for forming structures upon a substrate. The method comprises: depositing fluid onto a substrate so as to define a wetted region, the fluid containing electrically polahzable nanoparticles; applying an alternating electric field to the fluid on the region, using a first electrode and a second electrode, so that a plurality of the nanoparticles are assembled to form an elongate structure extending from the first electrode towards the second electrode; and removing the fluid such that the elongate structure remains upon the substrate.

20 Claims, 25 Drawing Sheets

(51) Int. Cl.
*B82B 3/00* (2006.01)
*H01L 29/06* (2006.01)
*H01L 21/02* (2006.01)
*H01L 21/326* (2006.01)
*H01L 21/67* (2006.01)
*H01L 21/66* (2006.01)
*H05K 3/12* (2006.01)
*G02C 7/04* (2006.01)

(52) U.S. Cl.
CPC .. *H01L 21/02422* (2013.01); *H01L 21/02601* (2013.01); *H01L 21/02623* (2013.01); *H01L 21/02664* (2013.01); *H01L 21/326* (2013.01); *H01L 21/67115* (2013.01); *H01L 22/26* (2013.01); *H01L 29/0673* (2013.01); *H05K 3/1283* (2013.01); *G02C 7/04* (2013.01); *H05K 2203/1131* (2013.01); *H05K 2203/163* (2013.01)

(58) Field of Classification Search
CPC ......... H01L 21/02601; H01L 21/02623; H01L 21/326; H01L 21/67115; H01L 22/26; H01L 29/0673; H05K 3/1283
See application file for complete search history.

BOTTOM-UP METHOD FOR FORMING WIRE STRUCTURES UPON A SUBSTRATE

FIELD OF THE INVENTION

The present invention relates to a method for forming structures upon a substrate, and to a substrate having an elongate structure formed upon it, produced according to this method.

BACKGROUND TO THE INVENTION

Substrates containing narrow or high spatial resolution structures upon their surfaces are useful to a number of different industrial applications. A variety of known methods are currently used for forming ultra-fine structures and patterns on substrates and in particular nanowires or microwires having widths or diameters of the order of $10^{-9}$ to $10^{-6}$ metres.

Various top-down techniques for forming ultra-narrow wires are known, in particular lithography and electrophoresis. Additionally, bottom-up approaches to nano- or microwire production are currently used which assemble effectively one dimensional, or otherwise ultra-narrow structures by combining constituent particles. One example of an existing synthesis technique for nano-structures uses electrohydrodynamic activity triggered by the application of DC voltage to a fluid ink. Such electrohydrodynamics-based approaches allow fine structures to be printed upon substrates, however these techniques require a minimum degree of electrical conductivity in the substrate, so that a DC bias can be applied in all locations of the substrate. Therefore, electrohydrodynamics-based methods are limited to particular types of substrates having a specific range of dielectric and conductive properties. Indeed, for most electrohydrodynamic jet printing methods it is required or preferable that the substrate is sufficiently conductive to dissipate the charge that may otherwise accumulate locally. Although some different techniques for addressing this issue and using substrates having limited conductivity with such methods have been proposed, these necessitate a more complicated printing process.

Alternative known techniques employ photolithographic methods, wherein micropatterns are applied by transferring a predetermined geometry of a desired structure of pattern from a photomask to a light-sensitive substance upon the substrate, whereupon the exposure pattern is deposited or engraved in a predetermined pattern upon the substrate material behind the light-sensitive photoresist. While photolithography facilitates the rapid production of complex micropatterns which may have high spatial resolutions and complex geometries, the lines which may be produced by such methods are necessarily flat in profile, and so are of limited use in applications that require a structure to be formed that has a height of a given value or comparable to its width.

There exists a need for a method of producing ultra-narrow lines, having widths even less than 1 micrometre, made up of a variety of different inorganic constituent materials. In particular, there is a demand in a number of different applications for an efficient and scalable technique for forming fine conductive lines or patterns, as well as structures having semiconductor properties.

Examples of typical applications in which such a method of producing high-resolution micropatterns comprising a range of materials and disposed upon a range of different substrates may be useful include production of semiconducting quantum dots, for light emission applications, light absorbing semiconducting nanoparticles for photovoltaic energy conversion, or other dielectric materials for sensing applications.

SUMMARY OF THE INVENTION

In accordance with the invention there is provided a method for forming structures on a substrate, the method comprising:

depositing fluid onto a substrate so as to define a wetted region, the fluid containing electrically polarizable nanoparticles;

applying an alternating electric field to the fluid on the region, using a first electrode and a second electrode, so that a plurality of the nanoparticles are assembled to form a elongate structure extending from the first electrode towards the second electrode; and removing the fluid such that the elongate structure remains upon the substrate, further comprising, during the step of applying the alternating electric field, increasing the separation between the first and second electrodes by moving the second electrode away from the first electrode so as to further extend the elongate structure towards the second electrode.

The method allows uniform, nanoscale-width structures to be formed controllably on many types of surface without requiring the surface to be conductive. The inventors have realised that by depositing ink containing polarizable nanoparticles upon a wetted region of a substrate and by using an alternating electric field to cause the nanoparticles to concentrate into a structure extending along the direction of the electric field between two electrodes, it is possible to create wires or line structures that are many times more narrow that the width of the wetted region.

Using known methods of printing structures using wetted regions of ink deposited upon substrates, it is difficult or impossible to form narrow structures having high spatial resolution. Standard inkjet printing techniques are able to produce wetted lines of approximately 5 to 100 micrometres in width. Taking a wetted region having such dimensions as a starting point, and applying the method of the invention to deposit such volumes of fluid and arrange nanoparticles that are dispersed therethrough into concentrated agglomerations, it is possible to form an elongate structure comprising nanoparticles from the ink, the structure having a width of approximately 1 micrometre, attached to the substrate, having removed the fluid by drying. The ability to form such a narrow line provides a clear improvement over the prior art and may be advantageously employed in many different applications.

This novel printing technique further allows elongate nanoparticle structures to be formed having widths of less than 1 micrometre for instance. Widths of 250 nanometres and smaller are achievable using the method of the invention.

The method of the invention provides the major advantage that, even for relatively wide wetted regions, for example those having widths of 100 micrometres, the method allows the formation of ultra-narrow lines less than 1 micrometre in width therein.

Combining, for instance, electrohydrodynamic printing techniques with the method of the invention allows very fine wetted regions to be deposited, and then even finer structures to be formed within these regions before they are dried.

It will be understood that dielectrophoretic (DEP) self-assembly as employed by the present invention is an entirely different phenomenon from, and provides advantageous effects not provided by, electrohydrodynamic (EHD) self-assembly. The key difference between DEP and EHD is that, in the former, an external electric field acts on nanoparticles within the fluid, whereas in the case of EHD an external electric field acts upon a fluid. The implementation of each of these methods also differs. EHD printing requires a substrate to be placed between the electrodes applying the electric field, with the top electrode typically positioned a few micrometres above the substrate surface. If the thickness of the substrate is too great, or if the distance between the top electrode and the substrate surface is too great, the voltage required in order to effect the EHD assembly process will typically become prohibitively large. A further limitation of EHD is that this method is only suitable for printing upon flat surfaces, or surfaces having substantially low surface roughness, in order to keep the fixed distance between the top electrode and the substrate at the precisely required level.

A further distinction between the present claimed method and EHD is that, in the former, elongate structures or lines may be printed in a single run, producing structures with a reasonably high "height to width" aspect ratio. On the other hand, EHD techniques operate by building up lines layer by layer, since each layer is approximately the height of a single nanoparticle diameter. This is typically 70-100 nm. Thus the assembly or printing speed is fundamentally limited, as is the scalability of the process, in particular if thicker lines, e.g. of around 500 nm in height are required.

In some embodiments, the substrate and/or fluid may have properties which make the formation of narrow wetted regions difficult. Angled surfaces, surface tension, and roughness may cause deposited fluid inks to spread over larger regions upon the substrate surface than may be defined on more smooth or flat surfaces. The method of the invention provides an important advantage in such cases, in that ultra-narrow structures may be formed upon spread-out wetted regions in spite fluid lines or regions being wider.

Although the formation of fine structures is known in the art as being achievable using methods such as photolithography, the inventive method provided herein allows such structures to be formed via a far simpler process, which is scalable and may be applied using a wider variety of materials and substrate surfaces. The method is also highly efficient in that the utilisation rate of printing materials is very high compared with known techniques. For example, in photolithography, a large proportion of the materials are lost in the lift-off process, whereas in the method of the present invention, the majority of, or substantially all of, the materials for forming the printed structures are usefully consumed by the formation process.

The mechanism that underlies the assembly of nanoparticles within a fluid into the elongate structure is dielectrophoresis action. In its broadest form, this phenomenon involves the exertion of a force upon a dielectric particle in the presence of a non-uniform electric field. The application of an alternating field, that is an AC field, across a region of fluid containing electrically polarizable particles leads to a dielectrophoretic force being felt by the particles. Electrophoresis does not necessarily require an AC field, and DC electrophoresis effects may be created using DC fields also, not least since it is the field gradient which gives rise to the particle movement. However, the application of alternating fields may avoid some deleterious effects associated with DC electrophoresis, such as the disruption of the assembly process by electrolysis.

Typically, in accordance with the present invention, the force arises via interaction between the gradient of an inhomogeneous electric field and electric dipoles which are induced in the particles by the alternating field. Thus dielectrophoretic forces are exerted upon the particles, these forces comprising a first component resulting from an attractive electrostatic interaction between the dipoles directed along the direction of the electric field lines, which may result in a chaining effect, and a component arising from the dipole-non-uniform AC field interaction, being directed along the field gradient and typically leading to a concentration of particles being assembled at the end of a growing elongate structure.

The application of an electric field to nanoparticles within a deposited drop or line of fluid ink gives rise to nanoparticles agglomerated at the end of an electrode and aggregating directionally so as to cause an elongate structure made of nanoparticles to grow in the direction of the electric field gradient. These elongate structures, which are made from particles having diameters in the order of nanometres, typically have dimensions of the order of 10s, 100s or 1000s of nanometres in height and width, and it is therefore this phenomenon which contributes to the ability of the invention to produce ultra-narrow line structures.

During the step of applying the alternating electric field, the method further comprises increasing the separation between the first and second electrodes so as to further extend the elongate structure towards the second electrode. In other words, moving one or both of the electrodes so that the distance between them increases causes the elongate structure to grow in length by the addition of extra particles to an end of the structure at an assembly region proximal to the moving electrode.

An advantage of the method of the present invention is seen when the second electrode is moved, while the first electrode remains in its initial position, and when the strength of the applied electric field is adjusted so that the growth rate of the assembly of nanoparticles may remain constant. The aggregation of particles to the growing end of an elongate structure may result in a constant growth rate and structures that are substantially uniform in their cross-sectional size and shape, that is their thickness, height, width or cross-sectional area in a plane perpendicular to the elongate axis, that is the direction of growth. Where a constant or uniform growth rate is maintained, the resulting morphology of a formed structure may also be uniform. It is therefore additionally advantageous to keep the growth rate and electric field conditions uniform over longer distances, in order to achieve more uniform structures.

The method of the invention therefore provides a novel and advantageous technique for printing ultra-fine structures on a surface or substrate by moving one of the electrodes around the surface. This method contrasts with nanoparticle assembly techniques of the prior art, in which fixed, that is non-movable, electrodes do not provide the printability afforded by the method of claim 1. In other words, the ability to move one of the electrodes freely so as to create large or complex patterns formed from elongate structures provides a clear advantage over prior art techniques. With these known techniques only small structures may be formed by self-assembly, with line lengths typically below 1 millimetre.

The present invention makes it possible to print nanomaterials with sub-micrometre line widths using dielectrophoresis. This makes it possible to print structures without any particular length or size limit. For example, sub-micrometre lines assembled from nanoparticles may be formed having lengths in the order of several centimetres. The free movement of the electrode during the assembly process allows an advantageous degree of freedom over the size and shape of the printed structures, thereby overcoming the limitation to assembling straight lines only which is seen in prior art assembly techniques.

The strength and gradient of the electric field are controlled, by way of adjusting the electric potential applied across the first and second electrodes, in order to achieve this constant growth rate. Preferably, the same field conditions should be experienced by the end part of the elongate structure and dispersed nanoparticles that are proximal to it, at all times as the structure grows.

It may be advantageous to begin the growth process using a field strength that is greater than that applied during the remainder of the process in order to encourage the initial formation of a structure upon an electrode and begin the growth process more easily and rapidly.

While a method of the invention may preferably involve keeping the first electrode stationary and moving the second electrode in order to achieve this growth, it would be possible to move both electrodes away from each other. However, this would greatly increase the mechanical force applied to, and therefore the stress felt by, the formed assembly of nanoparticles. This could lead to the breaking of the elongate line structure and its destruction. Therefore, it is preferable that the structure is formed such that a first end of the structure is in contact with the first electrode, which is stationary, and the second end, or growing end, of the structure is kept proximal to the second electrode as the structure length increases by way of moving the second electrode. In this way, the risk of the structure being subjected to additional mechanical stress is reduced.

Preferably, therefore, the separation between the first and second electrodes is increased by moving the second electrode away from the first electrode. Additionally, when moving the second electrode during the assembly process, it is possible to form elongate structures having various different shapes and geometries. Thus the method may be applied in any number of different fields requiring high resolution, or other linear shapes or line structures or patterns having a variety of different arrangements and geometries.

Typically, the relationship between the rate at which the length of the assembled elongate structure is increased and the rate at which the separation between the first and second electrode is increased causes the separation between an end part of the structure and the electrode to be such that the electric field in a region of the fluid proximal to the electrode and the end part of the structure causes mobile nanoparticles in that region to assemble upon the end part of the structure. Thus, as noted above, the dielectrophoretic force exerted upon particles in the region of fluid between the tip of the growing structure and the second electrode is kept constant in order to achieve a constant growth rate. The method of the invention allows for a constant electric field strength to be maintained over a relatively long formed elongate structure, which is not possible using methods that employ pairs of fixed electrodes.

The method may further comprise monitoring the rate at which the length of the elongate structure is increasing, and adjusting the properties of the alternating electric field in accordance with the monitored rate, such that the length of the elongate structure is increased at a predetermined rate. Monitoring the growth rate allows the generation of growth rate data which may be used as feedback in order to make corrective adjustments to the voltage signal supplied to the electrodes. In this way the magnitude of the field may be regulated such that it is the same at the end part of the structure throughout the duration of the process, that is the field strength and magnitude of the alternating field felt at the tip of the growing structure is kept constant. It may also be appropriate to adjust the frequency and DC bias if necessary, in order to achieve the constant growth rate.

Typically, the growth rate may be monitored by way of two techniques. The first technique involves optically monitoring the assembling structure. This will typically involve a camera or imaging device configured to transmit monitored optical or image data indicating the visual state of the wire to a computer containing graphical analysis software. Using such apparatus, the position, size, shape, and speed of growth or rate of change of position of the end point of the assembly may be continually monitored and measured. Should the growth rate decrease, a feedback loop in software with which the computer is programmed may be configured to increase the electric field in response, in order to increase the growth rate accordingly. Such micro-adjustments may be made in response to any monitored fluctuation in growth rate throughout the formation process.

Alternatively, or additionally, the growth rate may be monitored by monitoring the current flowing in the circuit to which the electrodes are connected. As the resistance due to the fluid between the tip of the growing structure and the second electrode will decrease as the separation between the structure tip and second electrode decreases, when the assembly grows at such a rate that the tip gets closer to the moving second electrode, an increase in current will occur and may be monitored by appropriate monitoring equipment in a circuit. Using data indicating changes of the electric current or resistance of the circuit, the electric field may be adjusted by way of feedback software and techniques in order to maintain a constant growth rate.

Although constant growth rates and the resulting uniform line thicknesses are preferable for applications such as the formation of wires for electrical conduction, should any particular application require the thickness of, or the height or width of, the wire to vary along the length of the wire, this may be achieved by making appropriate adjustments to the electric field in the manner indicated above, so as to increase or decrease the growth rate accordingly. Such a technique may also employ monitoring the growth rate to provide feedback data.

When creating elongate structures extending over long distances it may be beneficial to apply lower voltages to the electrodes than will typically be applied when forming relatively shorter structures. The lower-intensity electric fields resulting from such reduced voltages may stabilise the formation process and result in a more robust formed structure. This is because too high a voltage over too long a distance may result in a deleteriously high degree of fluid movement, and may result in unwanted forces being exerted upon the assembled structure. An electrohydrodynamic force exerted upon an existing structure, for example, may cause the structure to be damaged. Therefore, the electric field conditions, such as the AC frequency, should preferably be selected so as to strengthen the dielectrophoretic force causing the assembly, and to reduce any undesired electrohydrodynamic force. Typically, when applying the electric field to the fluid, each of the first and second electrodes is in contact with the fluid at a respective first and second position within the fluid. In this way, the start and end points of the structure to be formed are selected or determined based upon the starting first position and the final second position, that is the points at which the first electrode begins and the second electrode ends the process.

In some embodiments, an end part of the first electrode is positioned at the first position such that a first end of the elongate structure is positioned at a predetermined first end position upon the substrate. Thus the first end position of the elongate structure may be selected by beginning the process with the first electrode located over this point within the wetted region.

Typically, the electrodes are shaped such that each electrode acts as an electric monopole thereby producing an inhomogeneous electric field in the fluid when an electric potential is applied to electrodes. The inhomogeneity of the electric fields may facilitate the defining of the starting and ending point of the assembly upon a substrate. The use of parallel electrodes substantially having the form of plates, for example, may result in a random, less controlled or less predictable formation process wherein the wire begins growing at an apparently random point on an electrode rather than a point defined by the divergence of the electric field resulting from a pointed electrode.

Preferably, the electrodes comprise a material that is unreactive with the fluid in the presence of the electric field. Providing electrodes that are composed of unreactive materials may be beneficial to the method of the invention. It has been established experimentally that gold is a suitable electrode material in that it does not take part in any reaction with the fluid ink in the presence of an AC/DC electric field. By contrast, electrodes made from silver or copper will typically dissolve if used in such a process, and metal ions from the electrodes will build structures when nanoparticles are not present in the solution. This process takes the form of dendritic growth and results in a different assembled structure morphology. Such dendritic growth is also limited to the electrode material only, rather than the ink nanoparticles.

Preferably, at least one of the electrodes has an elongate shape that comprises a pointed end, and applying an alternating electric field to the fluid comprises bringing the pointed end of each of the electrodes in contact with the fluid. Such a technique may result in a more controllable growth process, since the smaller dimensions of the ends of the electrodes may allow the points with the induced electric field at which structure growth begins to be more precisely defined.

Preferably, the pointed end has a diameter of 1 to 100 micrometres, and the length of the pointed end is greater than the maximum height of the surface of the fluid above the substrate. The pointed, or tapered, end may thus have a radius of curvature up to 50 micrometres in some embodiments. Optimal structure formation results may be achieved using effectively point-like electrodes. The electrode tips may preferably have a diameter in this range, and a height larger than the fluid level, which will typically vary between the order of several millimetres to several centimetres, in different embodiments. The use of a point-like first electrode, from which structures are initially grown, in combination with flat or plate-type second, moving electrodes may produce growth results similar to those achieved using a pair of point-like electrodes, since the influence of the point-like electrode structure is principally upon defining the first end point at which nanoparticle assembly begins.

An advantage provided by the method of the invention is that the fluid only needs to be contacted with the electrodes, rather than requiring the electrodes to be immersed within it. The electrodes may be partially inserted into the fluid volume, with the end or pointed tip parts kept a fraction of the height of the fluid volume above the substrate surface. Thus it is not necessary for the electrodes to touch the substrate, and this is particularly advantageous in applications where fragile structures or forms are required, which may be broken by the mechanical stress applied by touching the electrodes to the substrates.

As noted above, typically the electric field is applied such that a dielectrophoretic force is exerted on the plurality of nanoparticles. Dielectrophoretic action is the driving physical mechanism which provides the advantageous growth achieved by the method of the invention.

Typically, the mobile nanoparticles within the fluid are attracted to end part of the assembled elongate structure that is distal from the first electrode, and the length of the elongate structure is increased by way of mobile nanoparticles progressively being attached to the end part of the structure. In other words, a line, wire or column of nanoparticles is assembled gradually by the progressive addition of dispersed nanoparticles to the growing end of the assembled structure.

Preferably, the electric field has a DC bias, and the DC bias is such that a first end of the structure is formed by mobile nanoparticles within the fluid attaching to the first electrode. A DC bias applied to the alternating electric potential signal across the first and second electrodes allows for directed growth of the elongate structures. In other words, configuring the electric potential such that it alternates about a mean, or central value on the voltage axis, that has a non-zero value causes directed growth in that structure begins assembling preferably upon one of the electrodes. The line will preferably begin assembling upon the first electrode, and the directed bias is advantageously in the growth process, until all the fluid has been dried and the structure is rendered static upon the substrate and does not move any further. Therefore, the combination of the AC and DC components of the applied electric potential enable an improved degree of control over the growth of the structure, particularly with regard to the direction in which it is grown.

The advantageous degree of control afforded by the inclusion of a DC bias in the signal applied across the first and second electrodes is especially beneficial in causing assembly to start from a stationary first electrode so that a structure can subsequently be grown or extended by moving the second electrode away. In other words, it is desirable for the nanoparticle wire to start growing from the fixed first electrode towards the movable electrode, and this may be achieved by causing the direction of the wire growth to be directed in particular from the first electrode to the second electrode using this DC bias. The process of self-assembly of nanoparticles may begin when a critical concentration of nanoparticles is achieved. It will be understood that a DC bias may attract nanoparticles to a particular one of the first and second electrodes by a Coulomb interaction, thereby locally increasing the nanoparticle concentration at that electrode.

It will also be understood that nanoparticle self-assembly via dielectrophoresis is possible in the absence of a DC bias. In embodiments wherein an unbiased AC signal is applied, however, a higher nanoparticle concentration or a higher AC voltage may be required in order to achieve the desired assembly effect. For this reason, the presence of a DC signal is preferred.

Typically, in embodiments wherein a first electrode remains in the same position relative to the substrate while a second electrode is moved during the growth of the structure from the first to the second electrode, the DC bias is such that the first electrode has the more positive (higher) DC potential and the second electrode has the less positive (lower) DC potential.

In some embodiments, the first electrode or the second electrode comprises a conduit and the fluid is deposited onto the substrate via the conduit. Thus, the fluid containing nanoparticles may be disposed upon the substrate through either or both of the electrodes themselves prior to and/or during the application of the alternating electric field using the electrodes. Preferably, the most practical setup involves the movable electrode, in embodiments wherein electrode movement is required, comprising a conduit rather than the fixed electrode. Delivering the fluid during the process of growing the structure by moving the second electrode along the line of the wetted region away from the first electrode allows the overall process to be carried out more rapidly, since the wetted region does not need to be drawn out beforehand. However, it would be possible to first deposit the fluid using the first electrode, which remain fixed after the depositing of the fluid.

Therefore, it is preferable that the fluid is deposited onto the substrate via the conduit while the electrode comprising the conduit is moved away from the other electrode. In many embodiments, the moving electrode is referred to as the second electrode while the stationary electrode is referred to as the first electrode.

Typically, the alternating electric field has a frequency in the range 100 to 1,000 Hz, and an amplitude in the range 1 to 10,000 volts per metre. Typically this amplitude value corresponds to the root mean square (RMS) amplitude, that is the square root of the mean average of the squared values of the AC waveform. It is likely that, in many embodiments, the amplitude of the electric field will vary throughout the volume of fluid to which the field is applied, and so these ranges of electric field properties are configured, by configuring the electric potential signal applied to the electrodes, to take these values in a region of the fluid proximal to, or between, the first and second electrodes or the growing, end part of an assembling structure and the second electrode.

Typically, the field, having AC and DC components is applied such that the growth of the assembly structure is rapid, while remaining uniform along its length. The greater the signal applied to the electrodes, the greater the force exerted upon the nanoparticles. However, this additionally results in distortions within the fluid, such as heating effects which may also result in boiling, due to electric current flowing through the small volume of fluid or through a very thin formed wire having high electrical resistance. If the AC/DC signal is too great, circulation of fluid, which may be caused by electrohydrodynamic-like forces, may additionally introduce an undesirable degree of mechanical stress upon the assembled structure and can cause damage and breakage to the structure. Thus, a voltage signal is chosen, in accordance with the materials of the nanoparticles, fluid and substrate of a particular application, such that the electric potential signal is sufficiently strong to allow structure growth at a reasonable speed, but without being so strong as to result in these aforementioned unwanted, damaging effects. The ranges recited above are preferred values, which should achieve this balance between speed and reliability. However, it is also possible to form structures outside of this diameter range, for example with AC frequencies as low as 10 or 50 Hz or as high as 5,000 or 10,000 kHz and amplitudes as low as 0.5 or 0.1 volts per metre or as high as 50,000 or 100,000 volts per metre. However, performing a process using fields having parameters outside of these ranges is also possible.

Typically, the alternating electric field is applied to the fluid by applying an alternating electric potential across the first and second electrodes, the potential having a DC bias in the range 1 millivolt to 10 volts. As noted above, it is the DC bias which contributes to the control over the directional growth achieved by the method of the invention. This is a preferred range, which may provide an optimal level of DC bias, although DC bias values outside of this range may also be used.

The first and second electrodes may be connected to a controller configured to control an alternating electric current between the electrodes such that the current has an AC amplitude in the range of 1 to 10,000 microamperes and a DC bias in the range 0.1 to 1,000 microamperes. The presence of a controller such as a potentiometer in the circuit is beneficial in that such a device may compensate for unwanted large currents which may arise in the circuit. These values are preferred ranges. More preferably, the current flowing through the circuit may be controlled to be in the range 10 to 1000 microamperes, or may be controlled to have a DC bias component in the range 1 to 100 microamperes. More preferably, the controller may be configured to control the alternating electric current such that the AC amplitude is in the range 10 to 1,000 microamperes and a DC bias is in the range 1 to 100 microamperes. Furthermore, controlled currents outside of these ranges are also envisaged.

Typically, the width of the wetted region has a minimum width in the range 1 to 1,000 micrometres. That is preferably, at the narrowest point of a wetted region upon which fluid ink is deposited, the region is between 1 and 1,000 micrometres across. Ideally, the region has a shape or path which corresponds to the shape of the required elongate structure to be formed. Owing the physical properties of the fluids involved, it is quite difficult to deposit fluid at very high spatial resolutions. For instance, inkjet printing enables lines to be disposed at widths of 50 to 100 micrometres. Using such wetted lines the method will allow the final line width achieved by assembling nanoparticles to be less than 1 micrometre.

It is also possible, in principle, to first deposit the fluid onto a large area on the substrate and later form, for example, a set of parallel lines from elongate nanoparticle structures. Such an application may be useful in the production of transparent conductive films (TCF), as transparent electrodes for solar cells, or for different display types.

If the wetted region is very large, such as a film or sheet of fluid extending across the substrate surface, the method of the invention would also be operable. However, owing to the limited distance from the electrodes and structure end part over which the electric field strength is sufficient for exerting a useful dielectrophoretic force upon nanoparticles, not all of the nanoparticles in such a sheet or film or fluid will be consumed by the assembly process. As it is advantageous to utilise all of, or as great a proportion as possible of, the nanoparticle material in the fluid in order to build the structures, it is preferable that the electric field strength is applied such that the nanoparticles dispersed throughout the entire volume of the deposited fluid are attracted to and join the assembled structure during the growing process.

It has been determined experimentally that the distance within which dispersed nanoparticles may be collected effectively using typical materials and electric field parameters is approximately 500 micrometres. Therefore, nanoparticles substantially further than this distance away from the assembly region between the end of the growing structure and the second electrode may not be subjected to a dielectrophoretic force strong enough to cause these particles to join the assembly. This approximate 500 micrometre range means that a wetted region of approximately 1 millimetre in width, whether in the form of a line or a droplet, may be used in accordance with the method of the invention to produce a line of a few micrometres in width where the utilisation rate, that is the fraction of nanoparticles within the fluid that is used to form the elongate structure, is very high.

In the case of two or more elongate structures being formed parallel to one another, it would preferable to achieve this by way of two separate wetted regions. However, if fluid is deposited across an area of the substrate surface that is larger than such preferable wetted regions as that indicated above, it remains possible to grow multiple individual structures, for example parallel lines, if each assembly process is controlled by a separate electrical circuit.

Preferably, the wetted region has a shape corresponding to a predetermined geometry and the elongate structure formed within the fluid on a region at a shape corresponding to the predetermined geometry. Thus the method may involve drawing line patterns with fluid and concentrating the nanoparticles into much narrower or finer lines within these fluid lines. It is desirable that nanoparticles are only left upon the substrate after the drying process if these nanoparticles have been assembled into elongate structures, rather than having remained dispersed throughout the fluid. Therefore, having the shape of the fluid pattern map out the intended shape of nanoparticle structure to be assembled means that the fluid, and therefore dispersed nanoparticles, are only present at positions past which the second electrode will move, thereby causing all the dispersed nanoparticles to be collected into the elongate structure as it is built up along the length of the wetted line.

Typically, the two-dimensional structures which may be formed using the method of the invention will grow only in the volume of fluid upon the wetted region. For instance, in a scenario wherein an entire substrate surface is covered with fluid ink, and the second electrode is moved in the X and Y directions corresponding to the axes within the plane of the substrate surface, the assembled structure will typically have a form corresponding to a straight line between the first and second electrode. Therefore, in order to produce two-dimensional patterns using the elongate structures, it is advantageous to deposit wetted regions having shapes which correspond to these predetermined two-dimensional patterns. The method of the invention allows these patterns to be formed with much lower line widths. For instance, the elongate structures may have widths 100 times or 1000 times more narrow than the widths of the wetted regions in which they are formed.

Typically, therefore, the method further comprises moving the second electrode along a path corresponding to the shape of the wetted region during the assembly of an elongate structure such the shape of the assembled elongate structure corresponds to the shape of the path.

The method may comprise moving the second electrode along a predetermined path corresponding to the shape of the wetted region of a substrate, thereby assembling the structure such that the structure extends along the predetermined path from a first end position to a second end position within the region. The first end position and the second end position within the wetted region, at which the formation of the structure begins and ends respectively, may typically be located at opposite ends of an elongate wetted region, so that the structure is formed along most of, or all of, the linear extent of wetted region.

This step of applying the electric field may be repeated in some embodiments for fluid deposited in a second wetted region on the substrate, so as to form a second structure. In other words, it is envisaged that multiple elongate structures, which may vary in size and geometry, and which may or may not be attached to one another, may be formed within a plurality of wetted regions of fluid deposited upon the substrate.

In some embodiments, the first and second regions may overlap such that the structure formed on the second region may be formed such that it is connected to the structure formed on the first region. In this way, large compound structures may be gradually built by adding structures to the substrate one at a time using the method of the invention such that the structures overlap, intersect or otherwise contact each other.

In some cases, the second structure may extend from a first end position within the second region to a second end position within the second region and either of the first or second end positions of the second regions may coincide with the structure formed on the first region. In other words, the position and geometry of the second structure may be chosen such that either end of the second structure coincides with the first structure. This point at which the structures coincide may be at either end of the first structure, or the structures may be formed such that they coincide at any point in their respective lengths, and do so at multiple points, so that a wide range of compound patterns may be formed.

For example, a first structure or line may be formed in a first iteration of the process. In a second, subsequent, iteration a second line may be grown from the middle point of the first line by positioning the first electrode at this point.

It would also be possible to dispose a second batch of fluid upon the substrate so as to define the second wetted region located directly on top of the first wetted region, which may have already undergone drying. This would likely not result in damage to the first structure, and may provide the advantage that the second wetted region may be used to repair any broken points or discontinuities on the first formed line.

Typically, the fluid is deposited on the second region after the fluid is deposited on the first region. However, depending upon the application, the first and second wetted regions, as well as any additional regions in a possible plurality of regions upon the substrate, may be provided with fluid in any order or at the same time.

In some embodiments, the fluid is removed from the first region prior to the fluid being deposited upon the second region. Since the drying process will cause the formed structure in a dried region to be physically stronger and more robust, and more strongly adhered to the substrate surface, drying the fluid around each structure in a plurality of structures as they are formed reduces the risk of a formed structure deteriorating or being damaged during the creation of a compound structure or a plurality of structures. The method may comprise forming a respective structure within each of a plurality of adjacent regions on the substrate, such that each structure is connected to at least one other structure. This technique corresponds to the formation of a compound structure by building the compound structure piece-by-piece from component elongate structures, each being formed within its own wetted region.

The structures within the plurality of regions may be connected together such that they form a compound structure in accordance with a predetermined geometry.

An alternating electric field may be applied to fluid on a plurality of regions, using the first electrode and a second electrode in each of the respective regions, so that an elongate structure is formed in each region. The provision of more than one pair of first and second electrodes, and in particular the provision of a pair of electrodes for each wetted region, facilitates the rapid, and possibly simultaneous, formation of multiple elongate structures on a substrate. In addition to a plurality of regions in which a plurality of structures are formed, such a rapid or parallel method may be employed using as few as two respective regions and first and second electrode pairs. Alternatively, the same pair of electrodes may be used to form a structure in each of the different wetted regions one-by-one.

In some embodiments, the electric field is applied to the fluid on at least two of the plurality of regions at the same time, so as to form at least two structures simultaneously.

Preferably, in such embodiments, the plurality of electrodes used to apply the electric field to the fluid on each of the plurality of regions is arranged such that a plurality of elongate structures formed in the regions are joined together to form a compound structure. In such cases, the wetted regions may be joined together to form a larger wetted region, such as a long line made of dots or shorter lines, wherein fluid may either be disposed upon multiple or all regions at the same time, or the regions may be wetted, have structures formed within them, and then be dried, one-by-one.

Such arrangements mean electrodes may be static, or may move substantially less far in order to create a long line. This may be realised, for example, with comb-like arrays of multiple electrodes or alternating plurality electrode pairs. The spacing between such arrays of electrodes, which may have the form of a linear comb, or may also be arranged in substantially any one- or two-dimensional shape or pattern, including arrangements corresponding to the predetermined geometry of a compound structure to be formed, may be selected so that the electrodes are sufficiently closely spaced that the field strength between them, and between the electrodes and the formed structure, is sufficiently strong to result in the structure growth without any need to move the electrodes during formation. The size and shape of these arrays may be altered and scaled appropriately for the relevant application or required compound structure. For example, an array may comprise a two-dimensional matrix of 100 electrodes. Additionally, electrodes may be shared between regions, that is they may be spatially arranged and electrically connected to circuits such that they generate fields in more than one wetted region of fluid at a time, which may result in the rapid production of joined-up structures from different regions.

In some embodiments, a comb-like array of elongate electrodes may be used wherein every other electrode in a line of electrodes upon the assembly is movable, for instance via an automated mechanism. This will allow long compound elongate structures to be formed with wider electrode spacing, and therefore fewer electrodes, than would be necessary in arrangements where the electrodes in the array are static. In such embodiments, each pair of static and movable electrodes may have a separate or independent electric circuit to which it is connected in order to allow the growing process between each pair of electrodes to be individually and precisely controlled.

In some embodiments, parallel lines may be formed by providing a comb-like structure of "first", movable electrodes, together with a parallel comb-like array of "second", movable electrodes and increasing the separation between them such that each of the second comb electrodes is drawn along a wetted region having fluid disposed upon it.

Thus, several multiple electrode pair arrangements are envisaged, each of which would allow rapid and parallel formation of elongate structures.

In some embodiments, the substrate surface may comprise an electrically insulating material. Furthermore, the substrate surface may have an effective electrical conductivity that causes the substrate to behave as an electrical conductor. The conductivity of the surface upon which the structure is formed has an effect on the assembly process. For metallic surfaces, or surfaces with high degrees of electrical conductivity, the electric field between the electrodes will be very different from embodiments with less conductive substrates, as a current may flow via the substrate rather than via the fluid. In this case, the assembly process will not result as described above, and therefore it is preferable that the surface is substantially electrically insulating.

The method may also be performed with substrates having a limited degree of electrical conductivity, that is where the conductance of the path between the electrodes is lower than that which would be sufficient for current to flow through the substrate between the electrodes, rather than the current flowing through the structure of nanoparticles and with fluid in the ranges noted above.

Moreover, some known methods of forming narrow structures rely upon the use of electrically conductive substrate surfaces, and therefore the invention provides an advantage over the prior art in that it provides the ability to form nanostructures on insulating or semi-insulating substrates.

It is also possible to form structures by a method in accordance with the invention when the substrate surface is electrically conductive, as will be explained below.

Typically, the substrate surface comprises any of glass, polyethylene terephthalate and polyethylene naphthalate. This substrate may be in the form of a plate, film or sheet, with a surface that receives the fluid, being made from or containing these substantially insulating materials.

Typically, the surface of the substrate within the wetted region has a roughness average in the range 1 to 10 micrometres. Uniform, flat and smooth surfaces are preferable for the formation of uniform structures. However, it is envisaged that the method is also practicable on substrates having surfaces comprising steep or inclined surfaces.

The substrate may be optically transparent, translucent or opaque. The choice of such substrates having various optical properties will depend upon the application in which the invention is being employed.

The physical flexibility of the substrate may also vary, and the method may be performed on substrates whether they are rigid or flexible.

Typically, the fluid comprises a solvent, a surfactant, and an organic binder. The composition of the fluid is selected such that the formed lines are not broken during the drying process. This is effected via altering the surface tension of the fluid by the use of additives in the fluid.

The viscosity of the fluid selected for performed the method of the invention may vary between a wide range of values. An important factor in the selection of a fluid having a particular viscosity is the particular method being applied for depositing the fluid upon the surface. For instance, inkjet printing inks have a different viscosity range than screen printing inks.

The solvent, which is a principal or main component of the fluid composition, by mass, may be either polar or non-polar, or may be a mix of solvents. The different solvents which may be used may have different boiling temperatures. However, the fluid composition is typically selected such that, while the fluid may be made to readily evaporate during the drying process of the method, the fluid does not evaporate before the entire structure within a wetted region is assembled, as this premature drying would adversely impact the formation process.

Surface tension in the fluid may also vary between a wide range of values. However, a low surface tension value may reduce the mechanical stress upon the assembled structure during the drying process, and in this way may lower the risk of damage to the formed structure during the drying process.

The use of a mixture of two or more solvents within the fluid, the different solvents having different boiling points, may be helpful in order to engineer the drying dynamics of the fluid.

Typically, in addition to the solvent component, the fluid would further comprise, similarly to inkjet or screen printing inks, a surfactant and an organic binder, or one of these two. The surfactant has the function of reducing the surface tension of the fluid, even in the case that it exists in very small amounts within the fluid such as a mass fraction of 0.01% to 10%. A typical surfactant may be Triton X-100, which a commercially available surfactant. The organic binder may improve the adhesion of the formed structure to the surface during the drying process. An example of a suitable organic binder is glucose. The organic binders present in the fluid function as a glue or adhesive that improves the adhesion of the assembled structure to the substrate. This process may require increased temperature levels, typically by a range of 50° C. to 500° C., and more preferably between 100° C. and 250° C.

The mass fraction of the nanoparticles within the fluid may typically be in the range 0.01% to 10%. More preferably, the mass fraction of the nanoparticles within the fluid is in the range 0.02% to 5%.

Prior to the application of the electric field, the nanoparticles may be uniformly distributed throughout the fluid on the region. The uniform distribution of the nanoparticles throughout the fluid may be important to the formation of a uniform elongate structure. It is preferable that the nanoparticles should not agglomerate easily prior to, or without, the application of the alternating electric fields, and this formation is usually the role of a stabilising ligand attached to each of the nanoparticles.

In some embodiments, depositing the fluid contained in the nanoparticles onto the substrate may comprise depositing the fluid onto the substrate and subsequently adding nanoparticles into or onto the fluid. Whereas most embodiments will typically involve the depositing fluid onto the substrate with the nanoparticles already being present in the fluid, not least because it is advantageous to supply the fluid in a ready-made form that is prepared for use in the method of the invention, it may be possible or preferred in some instances to introduce some or all of the nanoparticles to the fluid prior to the depositing of the fluid on the substrate. This may be achieved, for example, by first depositing the fluid onto the wetted region and later applying a dry nanoparticle powder on top of the fluid. This would result in a different distribution of nanoparticles, which may not be spatially uniform. The surface tension of the volume of fluid may prevent the nanoparticles from penetrating the entire fluid volume. In such cases, all nanoparticles may remain at the fluid surface, and the assembly process would be similar to that described, albeit with the structure being assembled primarily on the surface of the fluid volume.

Typically, the fluid is removed by way of evaporation. Evaporation may be caused to occur or to speed up by way of application of heat to the substrate or the fluid. Additionally, the fluid may be removed by reducing the environmental pressure of the gas or atmosphere surrounding the fluid. In some embodiments, the fluid is selected so as to be sufficiently volatile that it evaporates sufficiently rapidly without requiring any pressure reduction or heating.

In such cases, the fluid evaporation rate and the assembly process rate are configured to be optimised so that the fluid evaporates shortly after the structure is formed, rather than before or a long time afterwards.

In some embodiments, the rate of fluid evaporation is increased by way of applying heat to the fluid, as noted above. Applying heat to the fluid may cause the adhesion of the assembled structure to the substrate to increase, which may be aided by a binder within the fluid.

Furthermore, the application of heat may cause the surface of the assembled nanoparticles structure to melt, not least because nanoparticles will typically melt at much lower temperatures than bulk structures composed of the same materials. In this way the adhesion between the structure and the substrate may also be achieved or increased.

Preferably, the method may further comprise a sintering process. Thus, structure of assembled nanoparticles may be caused to coalesce further into a solid, semi-solid or porous mass by means of heating and possibly compressing the structure. Although the assembled structure may be mechanically stable following the drying or removal of the fluid, the sintering process allows individual nanoparticles to be fused. Complete liquefaction of nanoparticles should preferably be avoided, because this may damage the desired pattern, for example by causing the formation of small droplets or islands instead of substantially cylindrical, fused elongate structures. This results in the formation of a more firm and stable elongate structure with increased conductivity so as to create an improved electrically conductive path, in the case that metallic or conductive nanoparticles are used in the method.

In some embodiments, such as those wherein quantum dots are formed using the method of the invention, the sintering step would be less practicable, since the sintered quantum dots may lose or forget their quantum confinement effects. In such cases, the structures would only be dried, without sintering the quantum dots or other nanoparticles together.

In some embodiments, the sintering process causes assembled nanoparticles to coalesce so as to increase the firmness of the assembled structure, as noted above. The increased durability, physical or tensile strength or resistance to breakage or damage which may thus result from sintering the structure is beneficial in many applications. The sintering of individual nanoparticles may be achieved by the application of very high pressure to the structure. In such cases, the fluid would not be removed by such a sintering process, whereas with sintering via heat the sintering and drying steps may be combined. It is therefore preferable in the majority of likely industrial applications of the invention that the application of heat is the selected method of sintering in preference to the high pressure technique.

Preferably, a sintering process causes the adhesion of the assembled structure to the substrate to increase. It will therefore be understood that, since increased adhesion may also be achieved by the heating or drying process, either or both of sintering and drying may contribute to the adhesion of the structure to the substrate.

Typically, the diameter of the nanoparticles is in the range 1 to 500 nanometres. More preferably, the diameter of the nanoparticles is in the range 10 to 100 nanometres. This diameter will typically be defined by the average linear size across particles in any axis, in the case of spherical particles. In cases wherein the nanoparticles have non-spherical or varying shapes, the diameter measure noted here may correspond to minimum, maximum, or average linear size across the particle in any access. The nanoparticles may be selected to comprise one or any of nanospheres, nanocubes, nanorods or any other nanoparticle morphology.

Preferably, the relative permittivity of the nanoparticles is different from the relative permittivity of the fluid. It is beneficial to the method of the invention that the effective dielectric constant of the nanoparticles and the fluid are different from one another. The larger the difference between these values, the more readily and efficiently the structures will be assembled by dielectrophoresis. A high degree of similarity in the effective dielectric constant of the nanoparticles may result in the assembling of elongate structures being rendered more difficult or not being achievable. In some embodiments, and in particular embodiments wherein an electrically conductive elongate structure is required, the nanoparticles comprise an electrically conductive material. In order for the method to be executed most effectively in the manner described, the assembled structure should have a sufficient degree of electrical conductivity that the structure itself may act as an extension of the electrode on which it is formed. The selection of metallic nanoparticles, for example, is suitable for achieving this. As noted above, such a choice of nanoparticles will result in electrically conducting structures, such as microwires or nanowires. The conductance of the formed wires may be aided by fusing nanoparticles together after they have been assembled into the structure.

In some embodiments, the nanoparticles may comprise a semiconducting material. Many suitable semiconductor materials are known, which may be formed into nanoparticles suitable for use with the method of the invention in cases where a semiconducting elongate structure or pattern is required. The nanoparticles may comprise, for example, one or more of: $ZnO$, $TiO_2$, $CdTe$, $CdS$, copper indium gallium (di)selenide (CIGS), or a combination of core-shell nanoparticles.

Such applications present a challenge for the method of the invention in that the semiconductor properties of the forming structure may result in the structure itself not being able to act as an extension of the first electrode, and therefore may prevent or render difficult the growth of an elongate structure caused by a dielectrophoretic force felt in an assembly region between a growing structure tip and the second electrode. A degree of electrical conductivity is required in order to grow the structure. The semiconducting material may have a known or predetermined or monitored energy band gap, being a gap in energy between bound and free states, at which electrons may exist in the semiconducting material. The method may further comprise exposing the fluid on the region, or exposing the structure, to radiation having photon energy greater than or equal to the band gap of the semiconducting material.

In cases of semiconductor structures being formed, it is therefore advantageous to include illumination of the fluid during the assembly process. The illumination light wavelength should be such that the energy of a substantial proportion of the photons of the radiation is higher than the band gap of the semiconducting nanoparticles, thus the photogeneration carriers in the conductance band render the material conductive so that it may provide the required electrical conductivity to enable the material to act as an extended electrode.

By selecting the appropriate illumination wavelength to which the nanoparticle structure is to exposed during the assembly process, the otherwise insufficiently conductive nanoparticle structure is rendered temporarily conductive enough that the requisite electric field conditions are produced at the growing end of the structure and the elongate structure may be further extended towards to the second electrode.

The inventors have realised that embodiments involving conductive nanoparticles result in elongate structures being formed with greater speed and with narrower line thickness than may be achieved using non-conductive or semiconducting nanoparticles, for example quantum dots. Therefore, additional illumination as described above may be beneficial in improving the method using particles that are not conductors, by way of inducing photoconductivity of semiconducting particles during the assembly process using illumination by light of the appropriate selected wavelength. In this way, the printability provided by the method is improved further.

Additionally, in some embodiments the nanoparticles may include a mixture of metallic, or conductive and semiconducting particles, as an alternative to being composed of nanoparticles all in the same conductivity class.

In some embodiments, the method will further comprise applying a metal layer to the outside of the elongate structure by way of electrodeposition or electroless or auto-catalytic plating. This may result in the thickness, width or height of the formed elongate structure being increased by the addition of material that is achieved by application of a galvanic bath plating process. This may be carried out, for example, with a copper plating solution. In addition to increasing the line thickness, such a process may improve the electrical conductivity of the formed lines, should this be required by a particular application. For example, copper deposition results in the nanowires having increased conductivity. The nanoparticle assemblies should be sufficiently robust and stable to survive the plating bath process.

In accordance with the invention we also provide a substrate having an elongate structure formed upon it, produced according to the above described method. It will be understood that such elongate structure-bearing substrates are particularly advantageous in that the substrates may have a range of physical, mechanical, optical, surface morphological, and electrical properties, while the structures formed thereupon may be ultrafine structures as narrow as 350 nanometres, or below 100 nanometres, for example, in width, while having a uniform width and cross-sectional size along their lengths, as well as having advantageously conductive or semiconductor characteristics. Therefore, a substrate according to the invention may be useful in a wide variety of technical and industrial applications. For example, one application may be covering glass or foils with a set or intersecting mesh of lines which are conductive, in order to obtain a high level of surface conductivity while retaining the very high optical transmission level of such surfaces, owing to the narrow width of the lines. It will also be understood that the uniform cross-sectional profile of the lines contributes to the uniformly high and reliable level of conductivity throughout such compound elongate structures.

Such a substrate may see applications such as a transparent conductive electrode, for example, as an indium tin oxide replacement.

In some embodiments, the substrate comprises an electrically insulating material.

The surface of the substrate upon which the elongate structure is formed may, in some embodiments, be electrically insulating.

Preferably, the elongate structure has a width, defined by the extent of the structure in a direction perpendicular to the elongate axis of the structure and parallel to the surface of the substrate upon which the structure is formed, of approximately 100 nanometres. This width value may be average or a maximum over the whole length of the elongate structure or for a particular section of its length. When a 200-500 nm wide wetted region of fluid is deposited, for example, the method of the invention allows a further reduction of the width of the final dried structure to 100 nm or even less.

Preferably, the aspect ratio of the structure is approximately equal to one. In other words, the height of the structure at a particular point is equal to, or is the same order of magnitude as, the wide of the structure at that point. That is the cross-sectional aspect ratio may be substantially square in dimension, whether or not the shape of the cross section is substantially square, round, a rounded square, or any other shape.

The provision of a substrate having a nanoscale or microscale structure disposed thereupon wherein the shape of the cross-section is not flat, but is rather approximately as high as it is wide, provides clear advantages in the way of physical robustness and integrity, as well as electrical conductance.

The shape of the cross-section in a plane perpendicular to the elongate axis of the formed structure may vary between different embodiments.

Such preferable aspect ratios are not practicable, or may not be achieved with methods of forming fine structures that are known in the prior art.

In accordance with the invention there is also provided an apparatus for forming structures upon a substrate, the apparatus comprising a print head for depositing fluid containing electrically polarisable nanoparticles onto a substrate, a first electrode and a second electrode for applying an alternating electric field to a wetted region defined by fluid deposited by the print head, and a fluid removal device for removing deposited fluid from the substrate.

Advantageously, the apparatus according to the invention is capable of printing structures comprising narrow lines formed from self-assembled nanoparticles upon a substrate.

The fluid removal device may preferably be a device for increasing the rate at which deposited fluid evaporates. In some embodiments, the fluid removal device comprises a blower, such as a fan, or it may comprise a heater. Such a device may be used for advantageously drying the ink upon the substrate after an elongate structure has been formed within the fluid in accordance with the invention. In some embodiments the heater may include a device such as a radiator or electric or heating element arranged to apply heat to the bottom of the substrate. For example, the apparatus may include a printing table on which a substrate for printing upon may be positioned, and this printing table may comprise a heater arranged to apply heat from below to the whole of, or substantially all of, the substrate. Such uniform heating may have the advantageous effect of speeding up the drying process.

In some embodiments, the heater may comprise a radiative heating unit arranged to direct radiant heat upon a region of deposited fluid proximal to the print head. Such a heating unit may comprise an optical heating unit such as a laser diode, a laser, or an infrared heater. This would provide the ability to apply heat locally to a targeted region of the substrate or of the fluid there upon, either instead of, or in addition to, some under-substrate heating or uniform heating, as described above. It is beneficial in some embodiments to use such a targetable or focusable heating unit to direct heat specifically to, or in a concentrated manner upon, a region just behind the printing head as the printing head moves along the path along which an elongate structure is being formed. In addition to speeding up the fluid drying process and thereby speeding up the printing process, such local heat application may also locally activate a sintering process wherein individual nanoparticles are melted or fused together so as to form a more cohesive structure. In particular, the use of a concentrated laser light source or a laser diode light source are envisaged for this purpose. Any such radiative heating unit may be attached to or mounted on the print head, or may be disposed separately from it at a position suitable for directing heat upon the fluid.

Typically, the second electrode is movable with respect to the first electrode. Thus it is possible to use the movable second electrode to print an extended elongate structure starting from the first electrode, which may preferably be stationary at the starting point along the elongate structured path on the substrate.

Preferably, at least one of the electrodes has an elongate shape comprising a pointed end. Preferably, the second electrode comprises a conduit for delivering the fluid to the substrate from the print head. The second electrode having the form of an elongate needle comprising a pointed end within which a conduit opening, or a nozzle, via which fluid may be deposited, is formed, is preferred. A second, movable electrode having this form would allow fluid to be deposited by the same element of the apparatus that also serves to contribute to the formation of a relatively high intensity alternating electric field suitable for dielectroporesis.

Therefore, in some preferred embodiments, the second electrode is formed as part of the print head. Indeed, the second electrode may form the print head or the print head may be the second electrode itself.

Typically, the apparatus further comprises a signal controller configured to control an alternating electrical signal to the first and second electrodes so as to apply an alternating electric field between the first and the second electrodes.

The signal controller may be configured such that the current has an AC amplitude in the range 1-10,000 µpA and a DC bias in the range 0.1-1000.0 µA. As noted above, such a configuration may be beneficial in some embodiments.

Typically, the apparatus further comprises a mechanism for moving the print head. This may comprise any form of conveyor or actuator by which the position of the print head or the second electrode in particular may be adjusted so as to move the print head across the substrate and thereby trace out a path along which fluid may be deposited and an elongate structure may be assembled.

Preferably, the mechanism is configured to move the print head in an XY plane substantially coplanar with the surface of the region of the substrate upon which the structures are to be formed. Preferably, the mechanism is also configured to move the print head in a Z direction substantially perpendicular to the surface of the region of the substrate upon which the structures are to be formed. In other words, the print head, or the second electrode, is movable by the mechanism in three dimensions denoted by the X, Y and Z directions. Thus the height of the moving electrode may be varied in accordance with the surface profile of the substrate so as to be able to print on non-flat or planar surfaces. Such movability in the Z axis is particularly beneficial for printing upon curved, inclined, or rough surfaces.

Typically, the quantity of ink deposited on a substrate surface in accordance with the invention will be low enough so that nanoparticle ink may sit or stay within the wetted region without running off or moving due to gravity. The dimensions, quantities, and fluid properties of the nanoparticle-containing ink may be selected such that the force of adhesion between ink and substrate may be stronger than any force due to gravity which might otherwise cause the fluid to move or be displaced from the wetted region. Owing to the volume of deposited ink being sufficiently low, the mass of deposited ink may also be small enough so that the weight of an ink volume is less than the forces preventing the ink from being displaced. Moreover, several parameters may be controlled so as to avoid the ink running off or moving when used in non-flat surface applications.

For example, a wide variety of binders or adhesion promoters may be added to the ink in order to improve the adhesion between the ink and the substrate.

Additionally, the surface free energy of the substrate may be altered by way of chemical or plasma treatment. Plasma treatment may allow surface properties to be achieved that would help to prevent deposited ink running from the desired wetted regions, such as by increasing wettability.

Additionally, the viscosity and the surface tension may be key parameters of the fluid ink composition that may have an influence on the movement or behaviour of deposited ink upon surfaces such as inclined or curved substrates. Both of these properties are related to the surface energy which quantifies the disruption of the intermolecular bonds that occur when the surface is created. Modifying and optimising these two parameters may therefore be beneficial so as to, for example, increase the viscosity and the surface tension and thereby encourage deposited ink to remain in the deposited surface area or wetted region.

Typically, the apparatus further comprises a print controller for controlling the movement of the print head. This may be a computer-operated or a user-operated device for providing control signals to the aforementioned mechanism so as to move the print head or the second electrode across the substrate in accordance with the desired elongate structure pattern.

In some embodiments, the apparatus further comprises a distance sensor configured to output a distance signal comprising an indication of the distance between the print head and the substrate. Such a sensor may be used to monitor the height of the print head or the movable second electrode above the surface of the substrate being printed upon in order to accommodate non-flat surfaces and correct the print head height so as to maintain a constant height or a preferred height range above the surface. Additionally, the print controller may, in some of embodiments, be configured to receive the distance signal and to control the movement of the print head in accordance with the distance signal so as to maintain an optimum distance between the print head and the substrate. An optimum distance or vertical height may be one at which the dielectrophoretic forces in the region of fluid within which particles are collecting upon the end of a growing elongate structure are maximised or caused to be at an optimum level for assembly. In other words, the apparatus may comprise an electronic control system that automatically maintains the electrode at the correct height above the surface at any given point during the movement of the electrode or the print head across the surface, using data monitored by the distance sensor. The distance sensor may be comprised within the print head or may be disposed separately from the print head within the apparatus. The vertical distance measurement between the moving electrode and the substrate may be beneficial for this reason, and the detector unit may therefore be attached to the second electrode. For example, detector units or distance sensors such as contact and non-contact detectors may be used. The selection of either of these types of sensor may depend upon the properties of the substrate including its transparency, its roughness, and its hardness.

For example, an optical sensor based on laser interferometry or an intensity-based sensor may ensure that an advantageous resolution and working distance is achieved. In both cases, optical fibres may be used in a sensor attached to a moving electrode.

A Michelson interferometer configuration can be used, with a laser for measuring subwavelength (nanometre range) displacements of an object. Interferometry combines the signals from two arms of the interferometer. These are first directed at a vibrating mirror and second attached to the moving electrode, and directed at the surface. Both signals are coupled, and a vertical distance may be calculated from the interference pattern.

An intensity-based sensor may also be used. In this case, an optical fibre bundle may be attached to the second electrode. Half of the fibres may transmit the light with the others receiving the light reflected from the surface. The amount of light reflected from the surface could be used for calculating the vertical distance.

A distance sensor may be attached or mounted to the print head, or may be positioned at any part of the apparatus from which the sensor may measure or monitor the height of the print head above the substrate.

Resolution and working distance may be achieved also by way of commercial high-accuracy contact sensors. Accuracy close to 1 µm is achievable by using optical or CMOS sensors for displacement measurement inside a pencil/needle-type sensor.

Signals from any kind of sensor may be used as feedback for adjusting the height to the correct distance between surface and the moving electrode.

Typically, the apparatus may further comprise a reservoir for containing the fluid. This may be formed within the print head, or fluid may be delivered to the print head from a distal reservoir outside of the print head via a duct.

In some embodiments, the apparatus may further comprise an image sensor configured to capture an image of the print head. This may comprise a camera or microscope with a field of view including the print head or the region of the substrate upon which printing is being performed, in order to provide visual or image data which may be used for controlling or refining the control or movement of the print head or the second electrode. Image data may be collected continuously by the sensor, and may be utilised either by an automated computer-controlled system which adjusts the movement of the second electrode in accordance with the topography of the substrate or alternatively it may be used by an operator for wholly or partially controlling the movement of the print head in a manual manner.

In some embodiments, the print head may be positioned and moved in an automated way by the aforementioned controller, in particular utilising an optical camera or image sensor configured to monitor or recognise alignment marks or symbols or fiducial points on the substrate surface. Thus the apparatus may, in these embodiments, automatically position the starting printing position on the substrate. In some embodiments, an operator may manually control the path along which the second electrode prints an elongate structure by visually monitoring an image feed from the image sensor.

BRIEF DESCRIPTION OF THE DRAWINGS

Examples of the present invention will now be described, with reference to the accompanying drawings, in which.

DESCRIPTION OF EMBODIMENTS

With reference to FIGS. 1 to 5 a method 100 for forming structures upon a substrate is now described. The method begins at step 101 in which an amount of fluid 2 is deposited onto the surface of a substrate 3. A wetted region 4 of the surface of the substrate 3 is thus defined by the region of the surface upon which fluid is disposed. The fluid contains electrically polarizable nanoparticles (not shown) in the form of silver nanoparticles having a diameter of 100 nm. The mass fraction of the nanoparticles within the fluid is 0.2%. The main component of the fluid is a solvent in the form of ethylene glycol. The fluid also contains a stabilizer in the form of glucose, which has a mass fraction within the fluid of 0.6%

Figure 1:
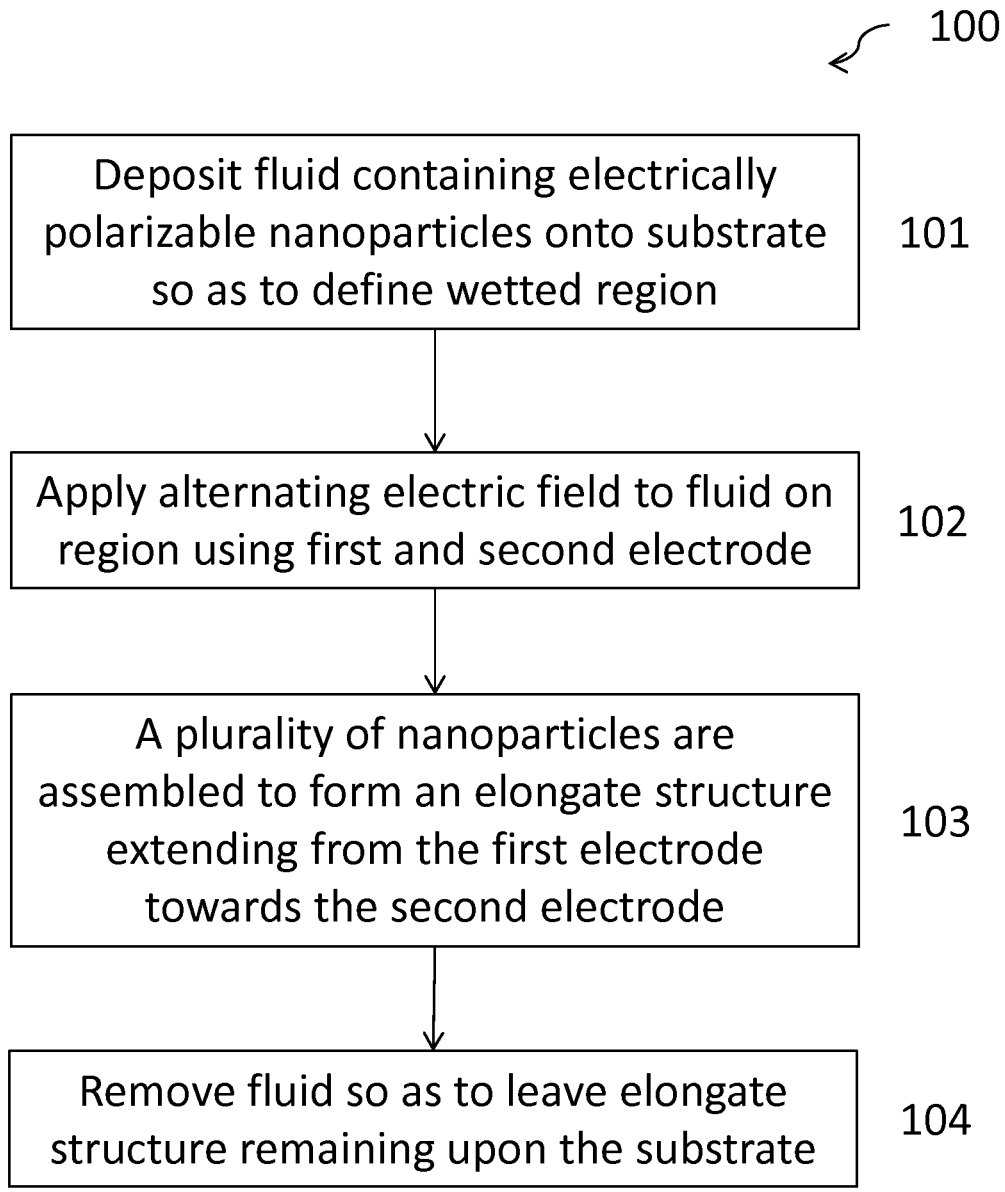
FIG. 1 is a flow diagram illustrating a method according to the invention.
Figure 2:
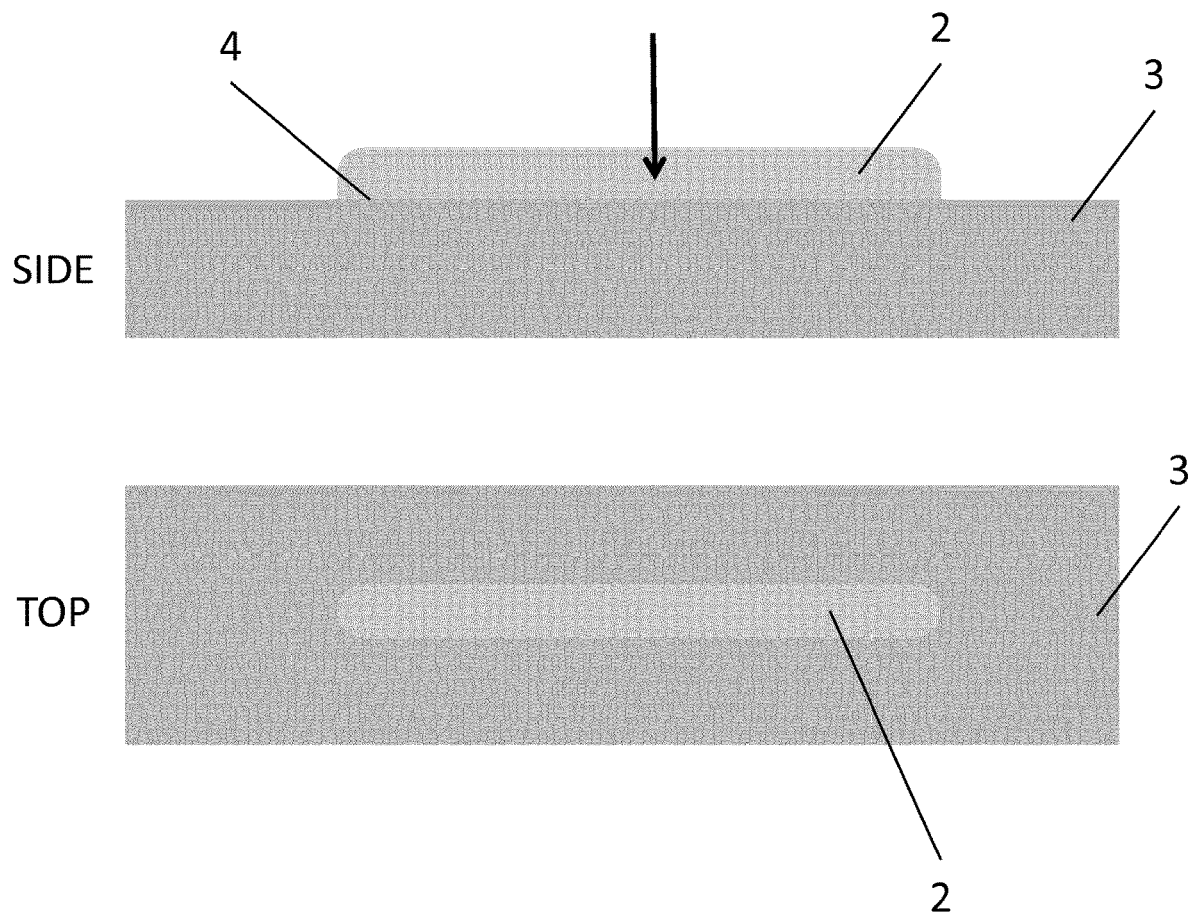
FIG. 2 is a schematic diagram illustrating a first step of a first example method according to the invention.

The depositing step is indicated by the arrow in FIG. 2, and is performed by capillary force deposition. The substrate may comprise a glass sheet or plate, or may comprise a metallic, conductive, semiconducting, or electrically insulating foil. As is apparent from the top view of FIG. 2, the fluid is disposed along a straight line across the substrate, thus defining a wetted region having an elongate shape, that is having a length dimension substantially greater than its width dimension. The width of the wetted region is approximately 500 µm. The shape of the wetted region may correspond to any of a number of different geometries. In the present example, a straight line has been selected as the predetermining geometry, with the objective of producing a similarly shaped elongate structure that is likewise in the form of a straight line upon the substrate.

In the presently illustrated example, the fluid has physical properties, including viscosity and surface tension values, which allow the deposited fluid to form a bead or a line having a height above the surface of the substrate that is sufficient for the execution of the method of the invention within the volume of the fluid.

Figure 3:
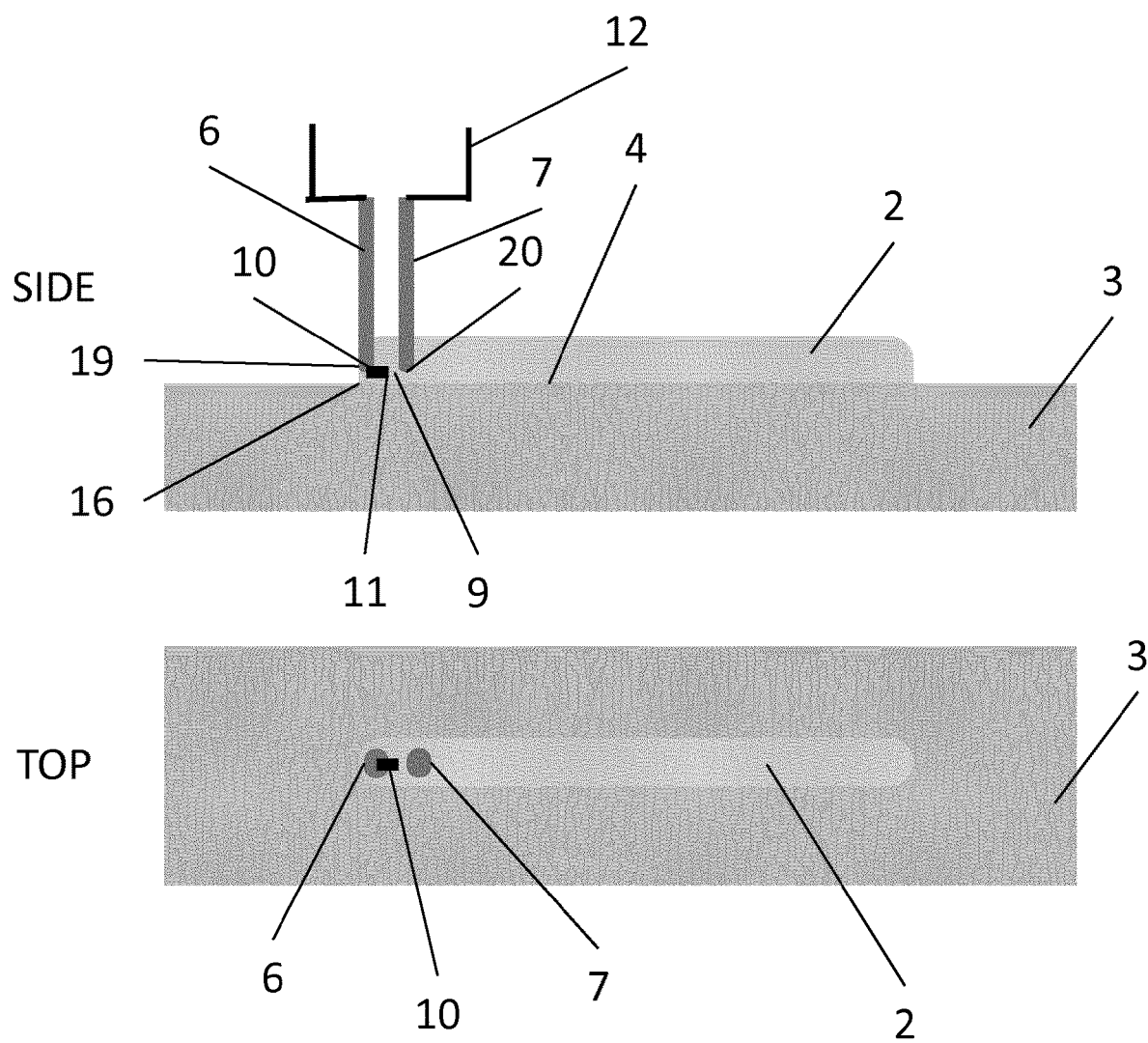
FIG. 3 is a schematic diagram illustrating a second step of a first example method according to the invention.

At step 102, a first electrode 6 and a second electrode 7 are introduced to the fluid 2. This is illustrated in FIG. 3. The gold electrodes 6, 7 are electrically connected to a circuit 12 producing a controllable electric potential, which may additionally comprise a device for providing an indication of the electric potential across the two electrodes, which may be a voltmeter or potentiometer. At the beginning of the structure forming process, which is illustrated in FIG. 3, the two electrodes are positioned at such that the tips of the electrodes are within the volume of fluid on the wetted region, and the tips are proximal to, although not in contact with, the surface of the substrate 3. The proximity of the electrode end parts to the substrate surface may vary between examples. In the present schematic, the distance between the first electrode 6 and the surface of the substrate 3 is shown as approximately corresponding to the expected or predetermined or configured height dimension of the structure to be assembled. That is, the electrodes is shown as being positioned at such a height that the structure to be formed from the tip of electrode 6 is assembled very close to, or in contact with, the substrate 3 surface. However, the height of the assembled structure may be independent of the height of the electrode above the substrate surface. In some embodiments, the height of the electrode ends within the fluid volume is such that line structures are assembled floating in the fluid between the electrodes, and are subsequently brought into contact with the substrate during the drying stage. The height of the elongate structure, that is the measurement of the structure from top to bottom, may be approximately the same as the width of the structure, such that the structure may have an approximately cylindrical shape with an aspect ratio of approximately 1. By configuring the electric circuit 12 to generate an alternating electric potential across the electrodes 6 and 7, an alternating electric field is applied to the fluid on the region.

The alternating frequency and amplitude, and the amplitude of the DC bias of the applied electric field, together with the chosen starting distance between the two electrodes are such that the electric field strength and gradient present at the region 9 between the electrodes results in the polarizable nanoparticles experiencing a dielectrophoretic force which causes them to begin to assemble together upon the first electrode 6. In the present example, the voltage applied across the electrodes has an AC frequency of 10 kHz, an AC amplitude of 70 V and a DC bias of 1.5 V. A current is thereby applied, having an AC amplitude of 400 μA and a DC bias of 1 μA. The inhomogeneous electric field is conducive to assembly via dielectrophoresis, not least because of the gradient or divergence of the electric field towards the electrodes generating the field. The shape of the electrodes is selected in part in order to produce such an inhomogeneous electric field, in that the electrodes each have an elongate structure and preferably a pointed end part (not shown).

The potential applied to the electrodes is additionally configured to have a DC bias which results in nanoparticles assembling by preference upon one of the two electrodes, which in this case is the first electrode 6. It can also be seen that the first electrode 6 is positioned at or close to a first end 16 of the fluid upon the region. This is done so that the position within the wetted region at which a structure begins to form (which is, in the present example, determined by the starting position of the first electrode) is at an extremity of the elongate wetted region, thus facilitating the formation of a structure having the greatest possible length within the region by extending along substantially the entirety of the length of the region.

At step 103, a plurality of nanoparticles are assembled to form an elongate structure 10 extending from the first electrode towards the second electrode. This plurality of nanoparticles corresponds to those particles within the fluid on the region that are sufficiently close to the region of assembly 9, wherein the electric field conditions are beneficial for assembling the particles via dielectrophoresis, in that they are attracted to and agglomerate upon electrode 6 so as to begin the forming structure 10.

Owing to the direction of the electric field between the electrodes, as structure 10 grows via the progressive addition to the structure of particles within the fluid, the assembling structure grows or extends towards the second electrode.

Figure 4:
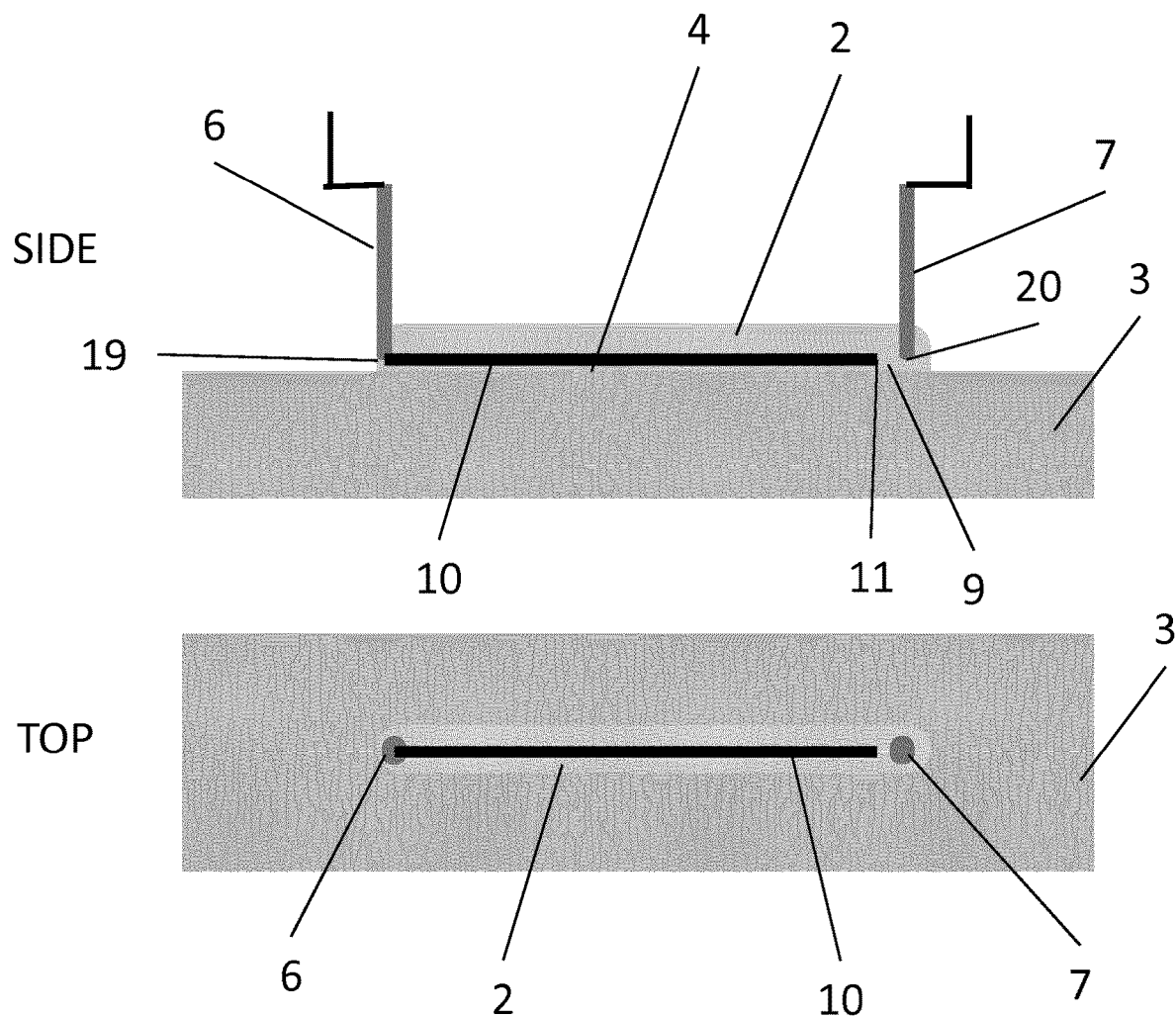
FIG. 4 is a schematic diagram showing a third step of the first example method according to the invention.

In the current example method, the second electrode 7 is movable during the process, and is moved along the elongate axis of the wetted region such that it is drawn away from the first electrode 6 at a speed of 50 μms$^{-1}$. In FIG. 4, the second electrode 7 is shown as having been moved along the length of the fluid on the wetted region and has reached substantially the end of the wetted region that is distal from the position of the first electrode 6. As is apparent in view of FIGS. 3 and 4, the current example method results in nanoparticles distributed throughout the fluid along the length of the wetted region being assembled to form an elongate structure 10 whose shape corresponds to the path along which the second electrode 7 is moved. It will be appreciated that the second electrode is moved along a path that corresponds to the shape of the elongate wetted region, and the assembled structure in the present case is a concentration of assembled nanoparticles along and inside of the fluid on the wetted region. Thus, by depositing an amount of fluid in a particular elongate geometry, in this case a simple straight line, upon the substrate, and drawing the second electrode along the length of the fluid at the appropriate rate while applying the appropriate alternating electric field, the polarizable nanoparticles that are initially dispersed throughout the fluid are concentrated into a fine structure within the fluid whose height and width are much less than those dimensions of the line of fluid on the region.

The growth of the elongate structure from the length shown in FIG. 3 to that shown in FIG. 4 is achieved by maintaining the rate or speed at which the second electrode is moved, as well as the properties of the electric potential applied to the electrodes This is performed such that, as the structure is grown by way of nanoparticles converging upon and assembling into a structure 10 connected to the first electrode 6 owing to the dielectrophoretic force attracting the particles to assembly region 9, this assembly region, wherein the electric field conditions cause dispersed nanoparticles to collect upon end part 11 of the structure, is effectively moved along with the end part 11 of the structure 10, as the structure is grown. Since the nanoparticles are sufficiently electrically conductive, the formation of the structure 10, shown at an early stage or formation at FIG. 3, effectively increases the extent of the first electrode 6, so that the electric potential applied to this electrode is transmitted through the structure 10, and so that the end part 11 of the structure 10 effectively acts as the end part 19 of first electrode 6. In this way, the optimal electric field strength and gradient which is produced, prior to the formation of structure 10, by the pointed end parts 19, 20 of the first and second electrodes 6, 7, respectively, is caused to exist between the end part 11 of the structure and the second electrode 7. This is achieved by moving the second electrode at such a rate, and by adjusting the electric potential properties, such that the required dielectrophoretic forces are experienced by nanoparticles dispersed in fluid proximal to the region 9 between the end 11 of the structure and the second electrode 7, as the structure 10 is progressively grown and the positions of the end part 11 and electrode 20 are accordingly moved along the length of the wetted region.

Figure 5:
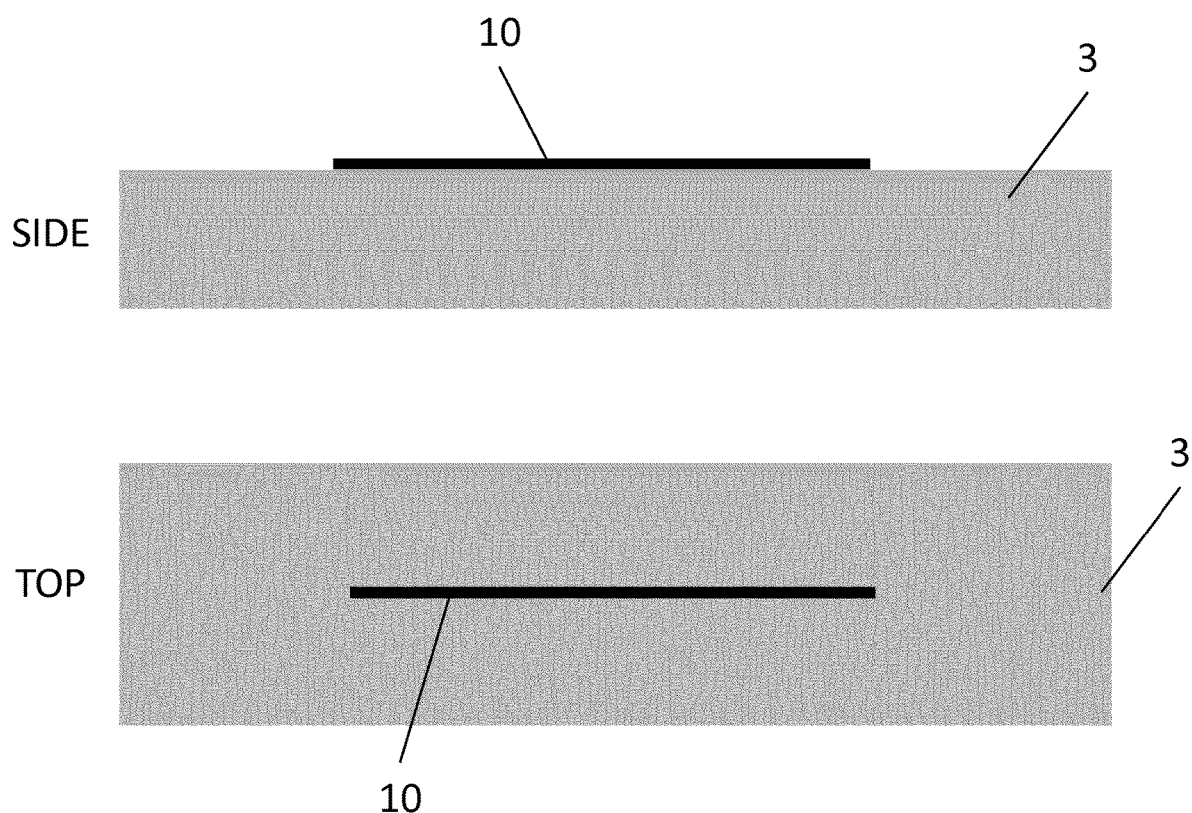
FIG. 5 is a schematic diagram illustrating a fourth step of the first example method according to the invention.
Figure 6:
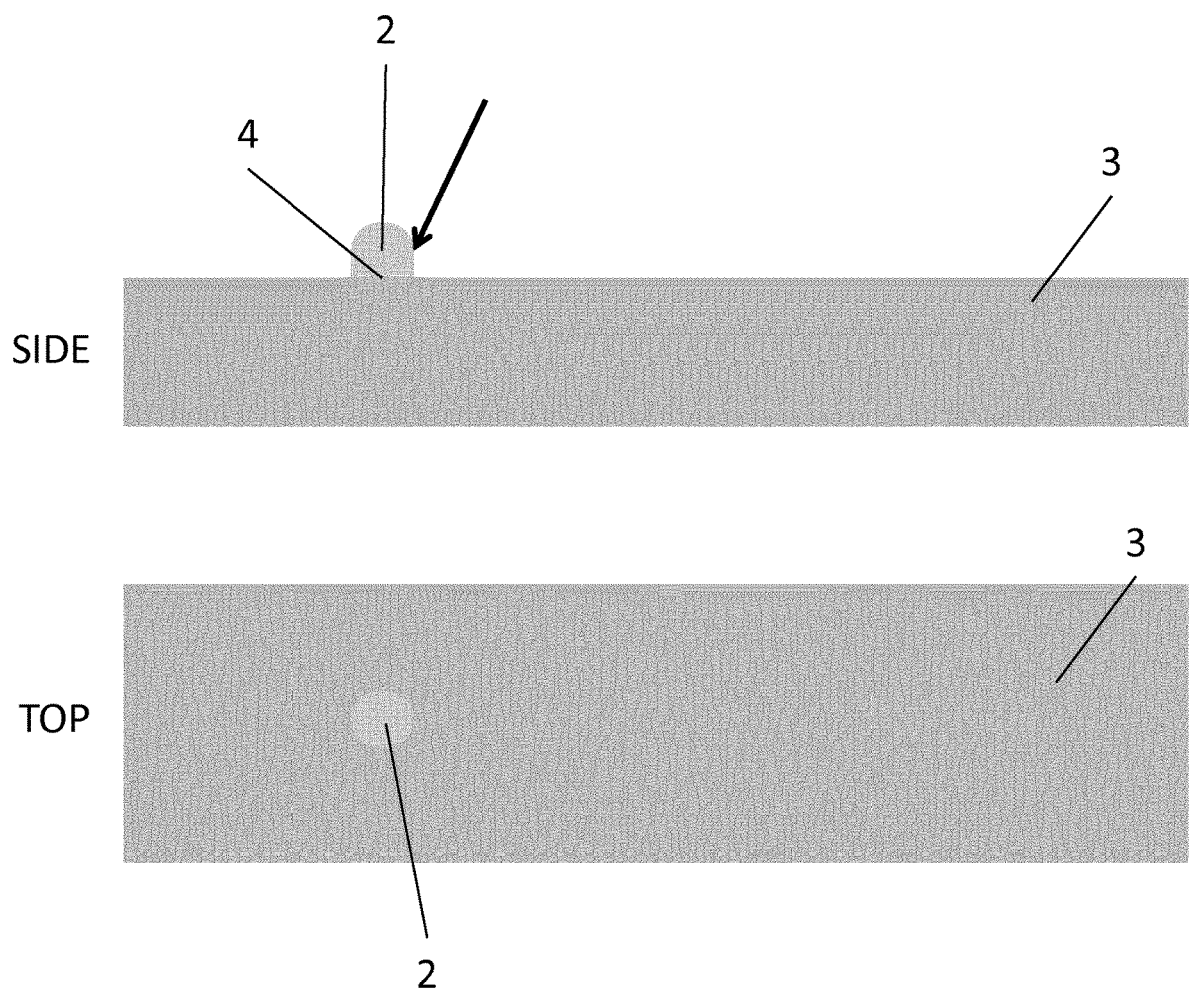
FIG. 6 is a schematic diagram illustrating a first step of a second example method according to the invention.

At step 104, once the structure has been assembled to form the desired shape or geometry, the fluid is removed so as to leave the elongate structure remaining upon the substrate. It may be beneficial to continue to apply the alternating electric field during the drying process. Keeping the AC signal on at this stage allows the dielectrophoretic assembling action to continue to keep the nanoparticles in their assembled structure until there is so little fluid remaining that the nanoparticles are no longer free or able to move. The signal may then be switched off after the nanoparticles have been fixed in their assembled positions within the structure by way of the fluid having been removed. In the present example, substantially all of the nanoparticles which were initially present, at step 101, in the fluid on the region are concentrated into the nanoscale width elongate structure 10. Thus, and as is illustrated in FIG. 5, the removal of the fluid by way of evaporation in the present example results in a concentrated, ultra-narrow conductive silver line or wire having been formed upon the substrate. It will be appreciated that the width of this line, as well as its height, will be substantially less than, and may preferably be three orders of magnitude less than (although this is not shown in the described Figures as such, for illustrative purposes) than the width and height of the deposited fluid line 2.

Additionally, the drying process is accelerated by applying heat to one or more of the structure, the fluid, and the substrate. In the present example, heating the substrate or the fluid to a temperature of 130° C. for a period of 15 minutes causes the structure to be dried and stabilized. This application of heat causes the adhesion between the structure 10 and the substrate 3 to be increased, thus producing a stable ultra-narrow wire adhered to the substrate.

As an additional step, the assembly may be subjected to a sintering process, for example by way of heating to a temperature of 150° C. for a period of fifteen minutes.

Optionally, the formed wire structure or pattern may subsequently be selectively plated using a galvanic bath or electrodeposition.

With reference to FIGS. 6 to 9, a second example method according to the invention which may be carried out using similar apparatus as shown in the previous Figures, is now described. The present example differs from the first example method in that, rather than depositing fluid along a linear, elongate wetted region upon the substrate, the present example comprises initially depositing a droplet or drop of fluid upon a wetted region of the substrate that is round or substantially circular. Since, as will be appreciated in the light of the above description, the shape of the structure formed using the method of the invention is largely determined by the shape of the wetted region of fluid containing the nanoparticles which are to comprise the structure, the present example will typically be performed with a view to producing a structure that is relatively short, compared with that illustrated in the previous Figures.

Figure 7:
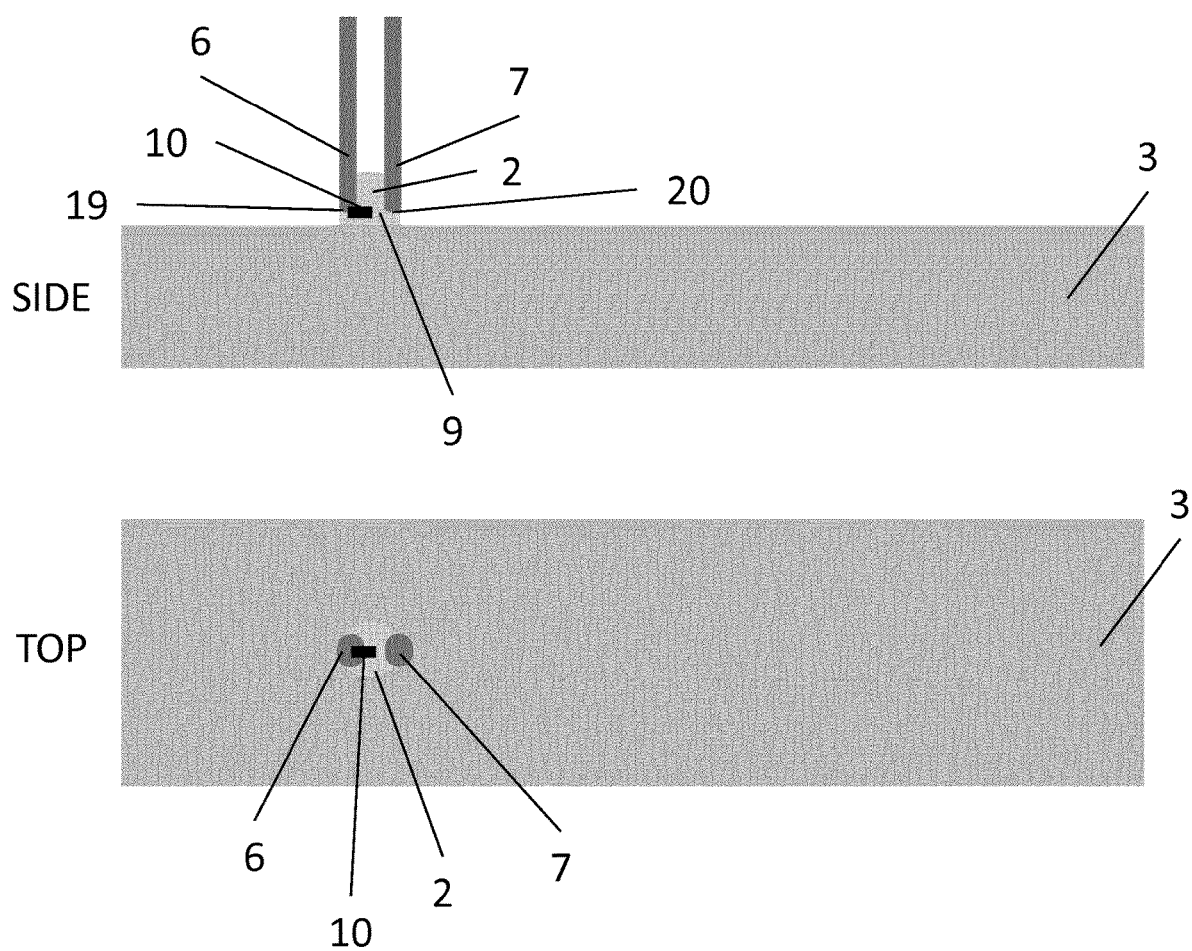
FIG. 7 is a schematic diagram illustrating a second step of the second example method according to the invention.

While the morphology of the wetted region in the present example differs from that shown previously, the steps of the method are similar to those as described above, and the dielectrophoretic mechanism responsible for the forming of the elongate structure is the same. The depositing of the drop of fluid is indicated by the arrow in FIG. 6. Following this, as illustrated at FIG. 7, the first and second electrodes are brought into contact with, and are caused to enter, the droplet of fluid 2. The dimensions of the droplet 2 are such that suitable electric field conditions for assembling a structure in the region 9 between the electrode ends 19, 20 may be produced by applying an electric potential of magnitude similar to that of the previous example, while positioning the electrodes 6 and 7 at opposite sides of the droplet 2. In the previous example, illustrated at FIGS. 2 to 5, assembling the structure by positioning the electrodes initially at opposite ends of the elongate line of fluid would not be practicable. This is partly because the distance between electrodes would be so great that the electric potential required to produce an electric field of sufficient intensity for structure formation would be so great that the deleterious effects such as unwanted electrical currents and forces upon the nanoparticles would result. Such an initial electrode positioning would also be disadvantageous when applied to the previous example because it would not result in the existence of the relatively localised assembly region 9 between the electrodes 6 and 7 (and eventually between structure end 11 and second electrode 7) which, as noted above, otherwise provides the method of the invention with an advantageous degree of control over the growth of the structure.

Figure 8:
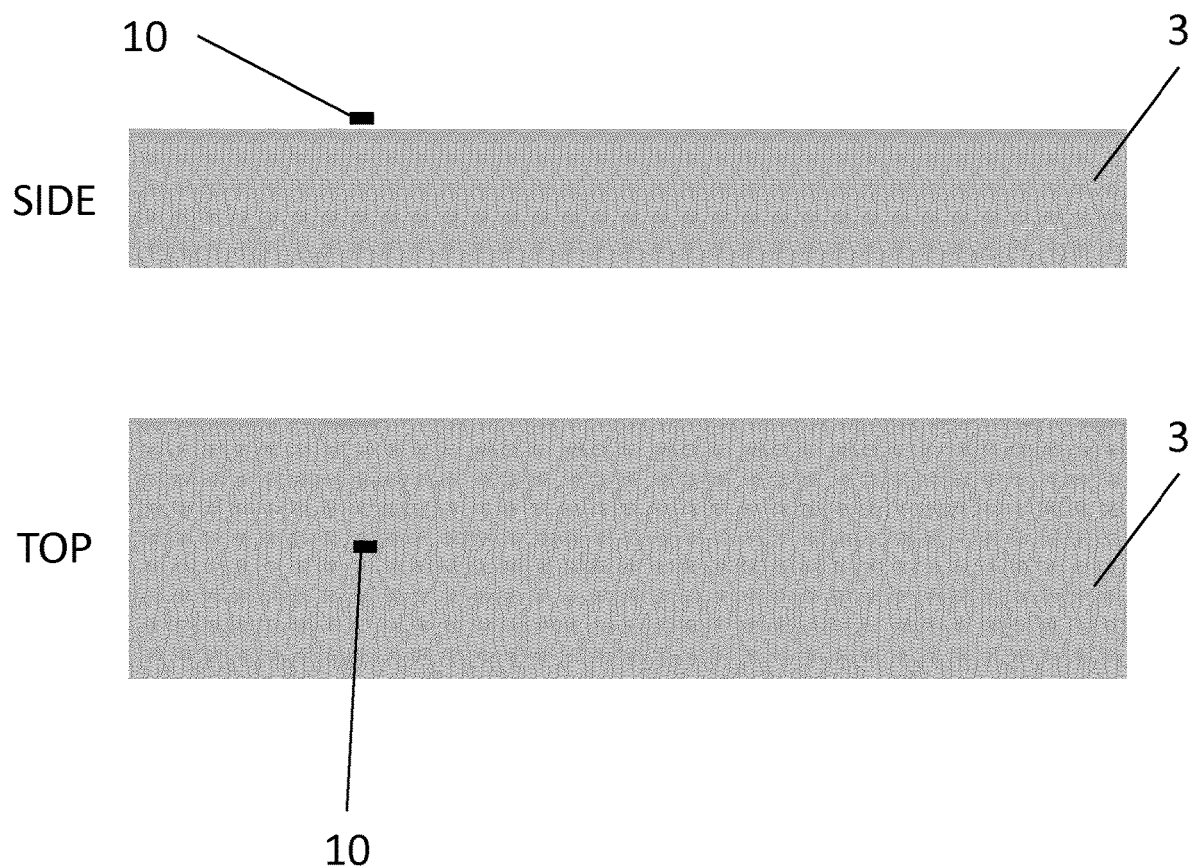
FIG. 8 is a schematic diagram illustrating a third step of the second example method according to the invention.

Once the shorter elongate structure of the present example is assembled as shown in FIG. 7, the fluid is removed by drying the substrate, similarly to the first example. The dried substrate bearing the formed structure is shown in FIG. 8.

Figure 9:
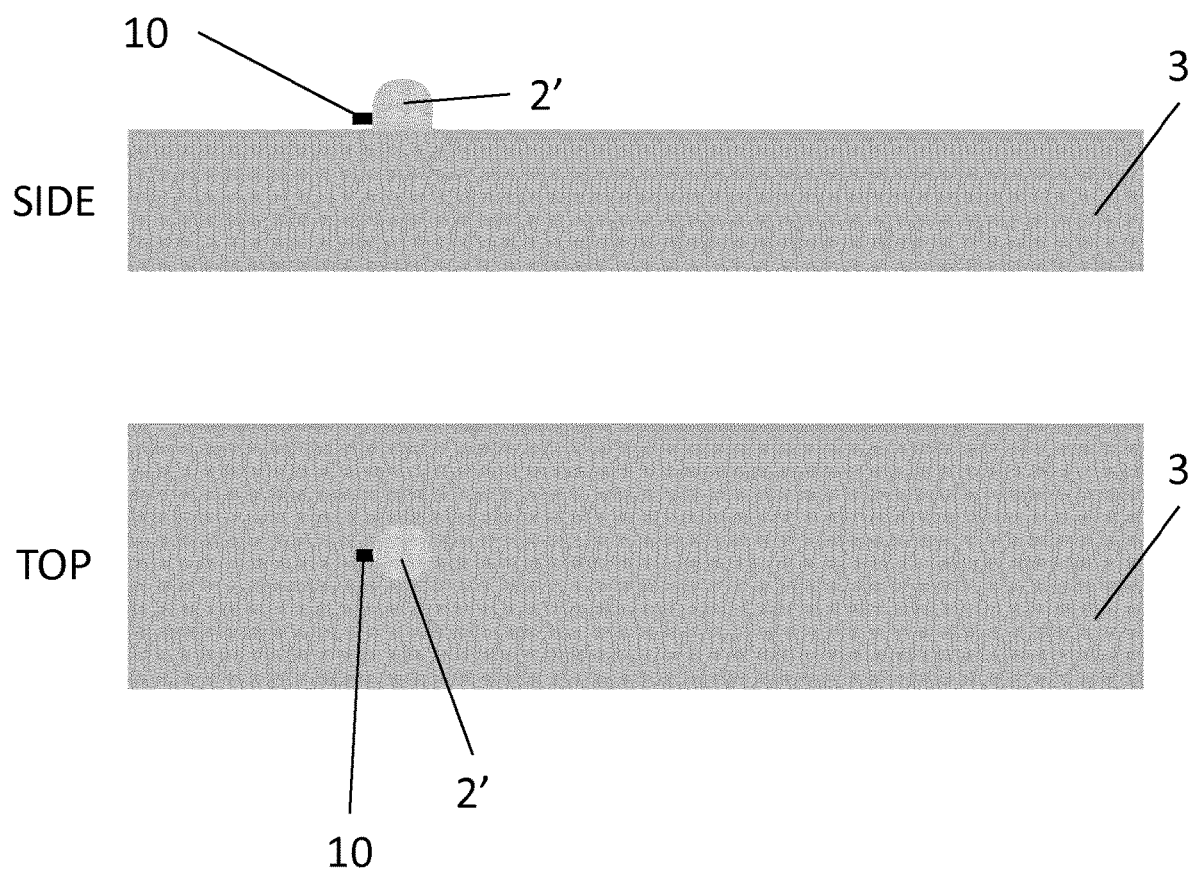
FIG. 9 is a schematic diagram illustrating a fourth step of the second example method according to the invention.

At the stage depicted in FIG. 9, following the removal of the droplet, a second amount of ink 2', that is the fluid containing the nanoparticles, is deposited in the form of a second droplet upon a second region upon the substrate adjacent to the first region. The process of forming a short elongate structure is then repeated. It will be understood that this technique of forming short sections of elongate structures within droplets of nanoparticle-containing fluid may be repeated many times to progressively build up a plurality or an array of short elongate structures on the substrate so as to form a superstructure or compound structure having a predetermined two-dimensional morphology or geometry. Thus, it is possible using the present example method to print complex two-dimensional structures having very fine spatial resolutions owing to the narrow width of the elongate structures.

The drop-by-drop approach allows the formation of a 2D microwire on nanowire structure or pattern over a substrate in a way that is advantageous over, for example, applying a relatively large film of fluid extending across the substrate and forming structures therein with shapes or patterns corresponding to movements of the electrode. By depositing small volumes of fluid at a time, the amounts of fluid may be dried more quickly and easily. Additionally, using small wetted regions in preference to a large film of fluid results in the distance from the elongate structures to the edges of the wetted regions being relatively small. Since the assembly of dispersed nanoparticles within the fluid depends upon the dielectrophoretic force felt by the particles, which in turn depends upon their distance from the assembly region 9 of the electric field, utilising small wetted regions allows all of the nanoparticles in a given drop or line to be consumed by the assembly process, leaving no, or very few, nanoparticles unassembled or dispersed within the fluid prior to the drying of the fluid.

The range of the dielectrophoretic force exerted by the electric field upon the particles is such that nanoparticles which are within a distance of approximately 500 to 1,000 micrometres from the end 11 of the formed assembly or the assembly region 9 are attracted onto the assembly and are consumed. Depositing volumes of fluid having linear sizes or widths greater than this may result in the dielectrophoretic forces experienced by particles on the periphery of such a volume of fluid to be of insufficient strength for moving the particles towards the assembly region 9.

Additionally, the drop-by-drop, staged approach to forming a complex two-dimensional structure provides the advantage that it is in principle possible to dry each drop very quickly after assembling the elongate structure in each drop. After each structure has been dried, it is physically stable and robust, and is resistant to damage and breakage. Thus, by dividing any intended or predetermined structure or microwire/nanowire pattern into small constituent parts and assembling the overall structure gradually, and printing and drying each part separately, the risk of damage and non-uniformities being suffered by the compound structure is reduced since at a given time it is only the part of the overall pattern that is being assembled within a drop of fluid at that time which is vulnerable to being damaged.

Figure 10:
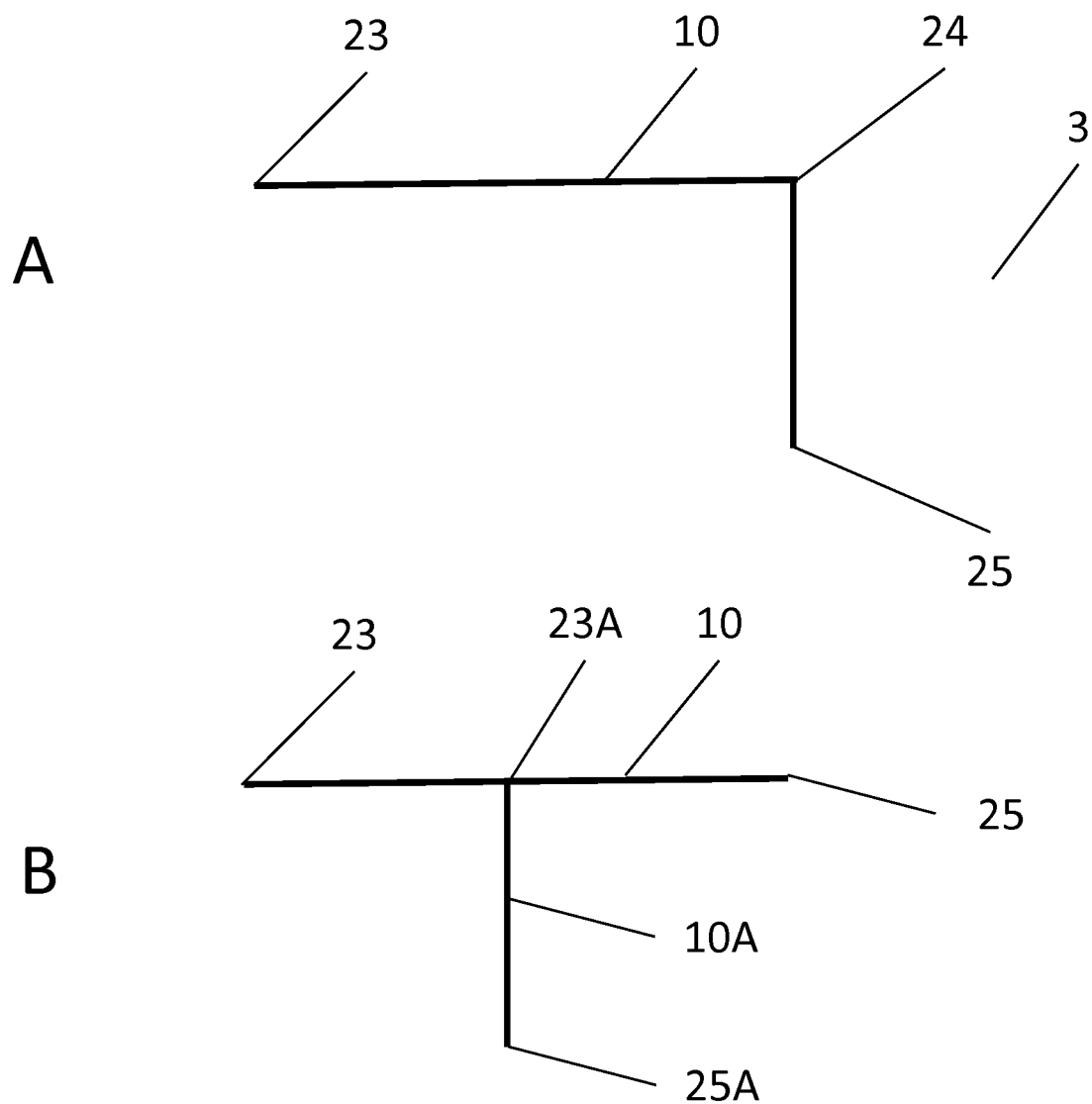
FIG. 10 is a schematic diagram showing a top view of example elongate structures produced by a method according to the invention.

FIG. 10 shows a top view of two example ultra-narrow wire structures which may be formed on a substrate in accordance with the invention. Each of the structures illustrated at A and B may be formed using the staged approach of the second example method. Additionally, the structure illustrated at A may be formed by depositing an elongate line of fluid along an L-shaped wetted region upon a substrate. In this case, the L-shaped structure may be formed from nanoparticles within the fluid by positioning the first electrode at the position on the substrate, within the region, corresponding to the location of the first end 23 of the structure, and moving the second electrode, as described above, along a straight line towards the corner of the L-shaped region whose position corresponds to mid-point 24 of the overall structure, and subsequently from point 24 to a point in the region proximal to, and slightly ahead of, point 25 within the region, which corresponds to the location of the second end of the formed structure 10. Alternatively, it will be understood that the structure 10 shown at A may be formed in two stages, each stage comprising the deposition of a straight line of fluid ink and the forming of a linear structure therein. Such an approach is also suitable for forming the structure similar to that shown at B of FIG. 10. This structure may be formed by creating a linear structure 10 extending between first end 23 and second end 25, in accordance with the first example method. Subsequently, a second structure 10A, may be formed such that it connects with the first structure 10, extending between first point 23A, which coincides with a point within the first structure 10, and second end 25A. Second structure 10A may be formed according to the method of the first example of the invention either before or after drying the fluid from the first wetted region in which first structure 10 was formed. Furthermore, the first formed part of second structure 10A may begin at either end 23A or 25A, that is the second structure may either be grown out starting from the point 23A of connection with the first structure 10, or it may begin being assembled at 25A and may be grown towards structure 10 until it reaches point 23A.

Figure 11:
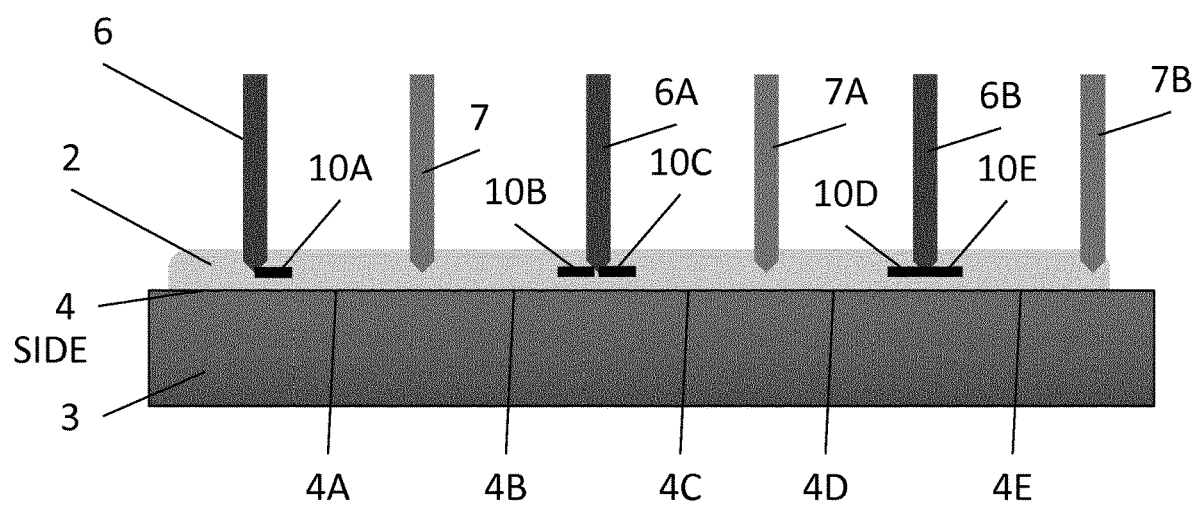
FIG. 11 is a schematic diagram illustrating a third example method according to the invention.

FIG. 11 shows a third example method according to the invention. In this example, the rate at which long lines of elongate structures may be assembled is increased by the use of multiple electrodes. As in the first presented example, a line of fluid 2 containing electrically polarizable nanoparticles is deposited upon substrate 3. As illustrated in FIG. 11, a comb-like arrangement of alternating positive and negative electrodes is provided, wherein the electrodes are arranged in a straight line corresponding to the shape of the wetted region. The spacing between the electrodes may be between 0.05 and 1 centimetre, although spacings more wide or narrow than this are also possible. The static comb electrode structure thus results in a plurality of sub-regions 4A-4E within wetted region 4, each sub-region has a similar arrangement, and thus results in a similar structure assembly, to that of the small wetted region 2 of the second described example.

As indicated above, the polarity, or the DC bias, of the alternating electric potential, of the electrodes alternates along the line. In the present example, each of electrodes 6, 6A, and 6B comprise part of a circuit similar to that of the second example. Electrode 7 therefore has the same function as the second electrode of the second example, and within wetted sub-region 4A, a short elongate structure 10A is grown, starting from the first electrode of sub-region 4A towards second electrode 7. Similar growth is seen, simultaneously with the growth in sub-region 4A, within sub-region 4B. Electrode 7 again acts as the second electrode, and electrode 6A transmits, together with electrode 7, an electric potential having a bias, frequency and amplitude such that short elongate structure 10B is grown from electrode 6A towards electrode 7. Thus, the pair of structures 10A and 10B are grown across sub-regions 4A and 4B, until each structure grows sufficiently that it extends to and contacts the other structure. As can be seen from FIG. 11, the repeating pairs of alternating polarity electrodes arranged along the wetted region 4 will cause the assembly of similar joining pairs of structures, 10C-10E and onwards, in regions 4C-4E and beyond. The forming of structures, which join to one another, simultaneously in multiple locations, enables long elongate structures to be formed rapidly in comparison with the previous examples. For instance, a one metre-long microwire or nanowire formed using the method of the present example may be completely formed in the same time taken to form a 500 micrometre line using the first example method.

In methods according to the present example, the structure growth rate may vary between each of the different structures 10A-10E. It may be the case that structures growing in adjacent regions, such as structures 10A and 10B, grow at different rates. This difference may be disadvantageous in that, if one structure, for example 10A, grows sufficiently quickly so as to make contact with an electrode, such as electrode 7, before a simultaneously and adjacently growing structure, such as 10B, has done so, the growth of the latter structure may be stopped prematurely owing to the conductive path through the former structure connecting two electrodes. Therefore, it may be beneficial to control the growth of each structure so as to ensure that their growth rates are uniform or that they all reach their end points simultaneously. However, such control may be difficult to achieve.

Figure 12:
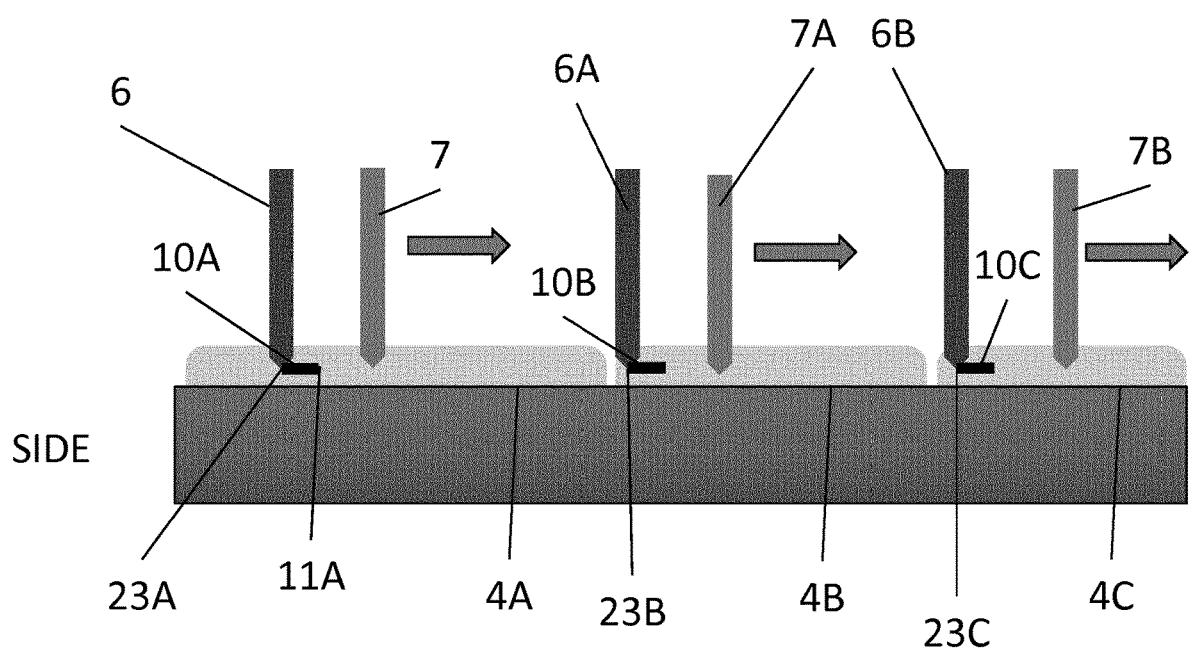
FIG. 12 is a schematic diagram illustrating a fourth example method according to the invention.

A fourth example method is illustrated at FIG. 12. Whereas the comb-like electrode structure provided in the third example method was analogous to the second example method in that it involved static electrode pairs whose separation did not change and the forming of relatively short elongate structures in relatively small sub-regions, the present example is analogous to the first described example in that it involves elongate wetted regions and electrode pairs wherein one electrode is gradually removed from the other. In each of the electrode pairs 6 and 7, 6A and 7A, and 6B and 7B, which are positioned in wetted regions 4A, 4B and 4C respectively, respective structures 10A, 10B and 10C are formed in a manner similar to that described in connection with the first example, by moving each of electrodes 7, 7A and 7B in the direction indicated by the arrows. These electrodes are moved along the line in which elongate regions 4A-4C are aligned, until each structure has grown sufficiently to join with neighbouring structures. In the case of the structure 10A formed in region 4A, the structure begins forming on non-moving first electrode 6 such that it has a first end point 23A corresponding to the position of the end part of electrode 6. The structure 10A is then grown by moving electrode 7 until the end part 11A of the structure has reached 23B, where it connects with the first end 23B of second structure 10B which has been formed simultaneously in region 4B.

Each electrode pair between which a structure is formed may be connected to a separate electric circuit, in order to improve the uniformity with which all of the multiple structures are assembled, thus producing a more uniform compound structure. To this end, each pair of electrodes may be connected to a feedback based process control device connected to the circuit. Each such device may measure the rate, progress or state of the growth of each respective structure, using either current measurements or visual data from images of the growing structure, in order to apply corrective adjustments to the applied electric field such that the assembly rate is uniform at all locations upon the structure, and along the overall compound structure.

It will be understood, for any of these comb-based multiple electrode methods which allow the simultaneous creation of multiple structures, the depicted examples are for illustrative purposes only and the number of electrodes or electrode pairs, and the relative arrangement of the multiple electrodes may be scaled in accordance with the required size of compound structure and rate of formation.

Figure 13:
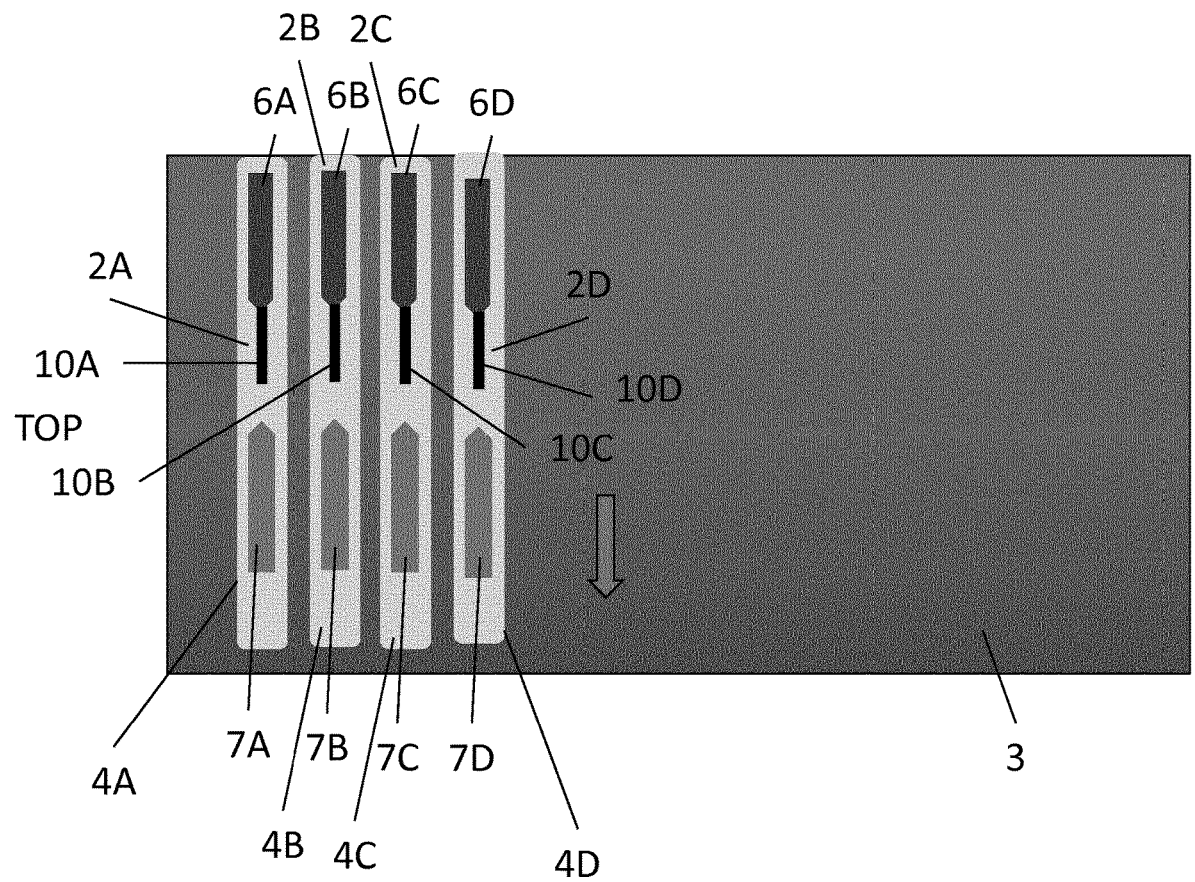
FIG. 13 is a schematic diagram illustrating a fifth example method according to the invention.

A third multiple electrode method in accordance with the invention is shown in FIG. 13. In this fifth example method, the electrode pairs are arranged in two comb-like structures aligned into two parallel combs, wherein an electric potential is applied across the plurality of pairs of electrodes such that each pair comprises a first electrode 6A-6D in one comb and a second electrode 7A-7D in the second comb. In the illustrated example, a plurality of wetted regions 4A-4D upon the substrate 3 each have a line of fluid 2A-2D disposed upon them. The fluid lines are deposited such that the lines are parallel to one another, and such that the spacing between them corresponds to the spacing between adjacent electrodes in each of the combs.

Using this example method, multiple parallel structures 10A-10D are formed by way of applying an alternating electric field across each of the electrode pairs and moving the second comb of electrodes 7A-7D in the direction indicated by the arrow as the structures 10A-10D are grown. Therefore this method is suitable for producing large numbers of parallel structures, which may each follow corresponding paths that deviate from the straight lines illustrated in the present example, similarly to the first example method, at a vastly increased rate by way of assembling the structures in parallel.

Figure 14:
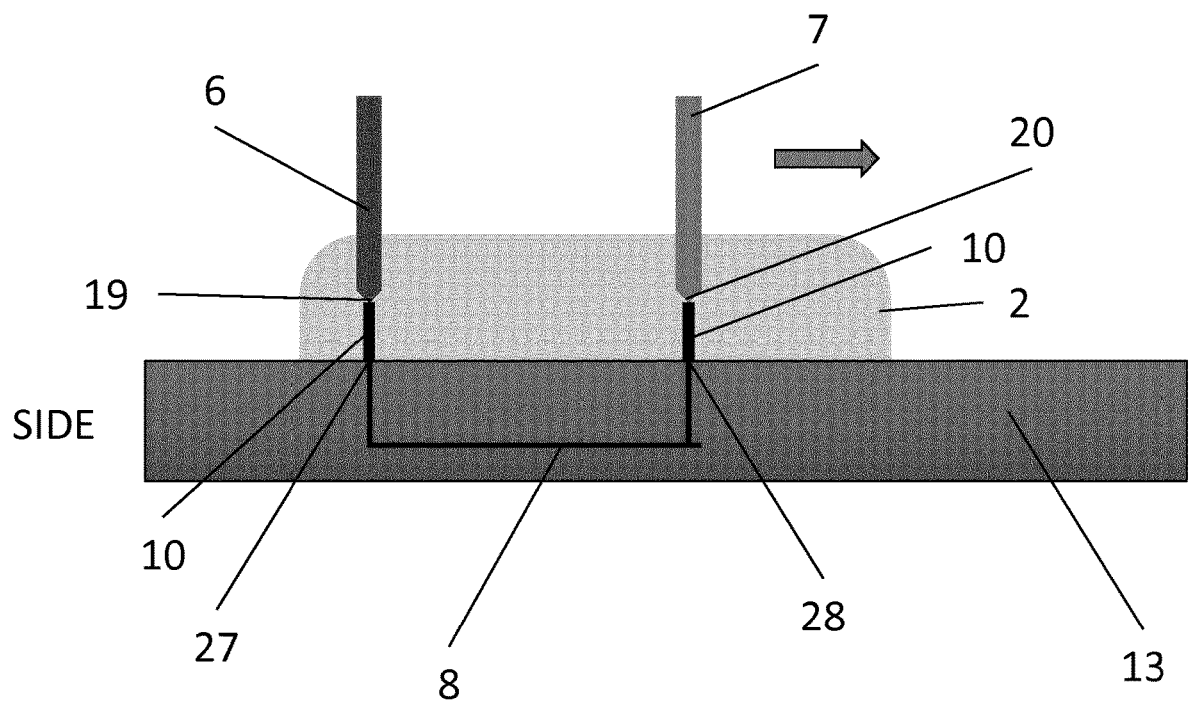
FIG. 14 is a schematic diagram illustrating the formation of structures from nanoparticles within fluid upon a conductive substrate.

The electrical conductivity of the material of the substrate 3 has an effect on the structure formation. This is illustrated in FIG. 14. In this example, the substrate 13 upon which the structure is to be assembled is electrically conductive. The arrangement shown in the Figure is similar to that of the first example described above and illustrated in FIGS. 2 to 5. The first and second electrodes 6 and 7 are positioned such that their respective end parts 19 and 20 are positioned within the volume of fluid 2 at some non-zero distance above the surface of the substrate 13. Since the substrate is electrically conductive, the electric potential applied across the electrodes causing a current to flow through the substrate 13 in preference to forming the field in the region of the fluid between the electrodes. The path of the current is illustrated schematically by the line 8 and the current flows from the end 19 of the first electrode 6 down the path of least resistance, via the shortest route to the surface of the substrate at point 27, through the substrate, and through a second region of fluid via the least resistive route from point 28 at the surface of the substrate to the end part 20 of second electrode 7.

Therefore, using this arrangement with a conductive substrate, a short section of structure is formed from nanoparticles within the fluid between each of the electrode ends 19, 20 and along the lines of the electric field to points 27 and 28 upon the substrate. The use of a conductive substrate results in difficulty in producing the uniform, ultra-narrow structures between the electrodes that the previously described examples are able to produce.

Figure 15:
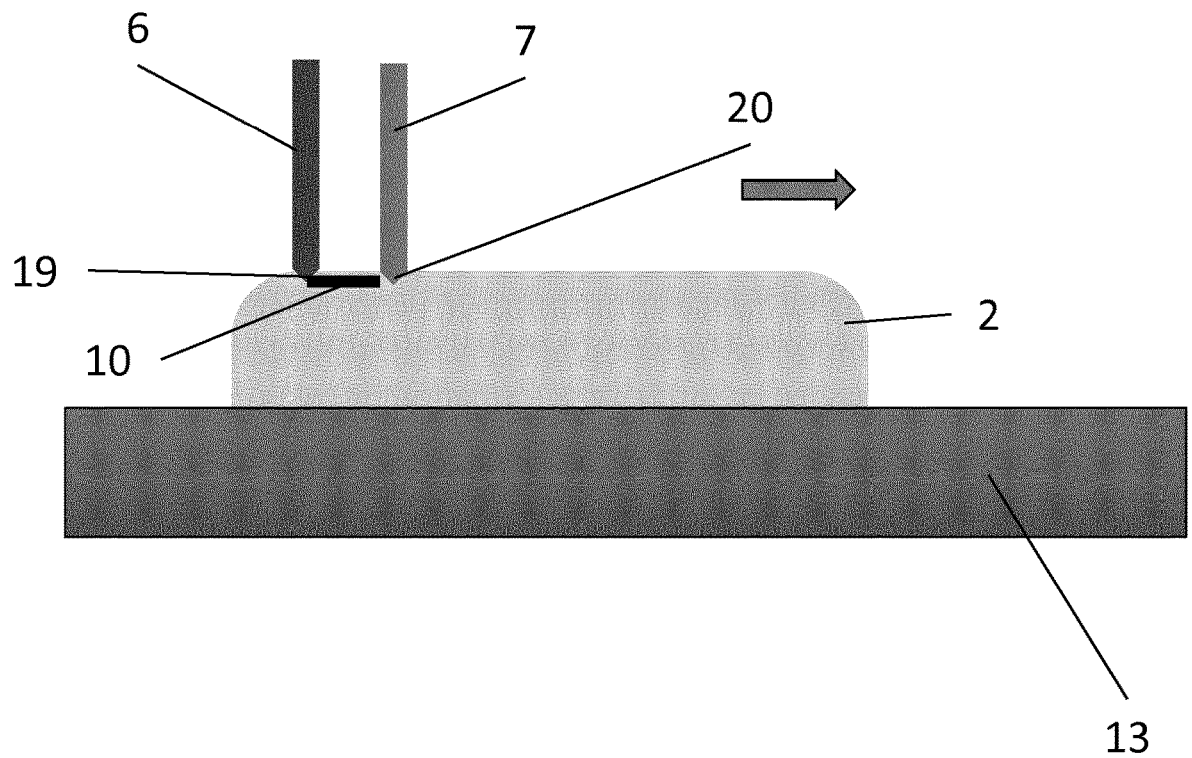
FIG. 15 is a schematic diagram illustrating a sixth example method according to the invention.

This problem may be overcome using the arrangement illustrated in FIG. 15 which shows a sixth example method according to the invention. This example differs from the first described example in that a conductive substrate 13 is used, and the electrodes 6 and 7 are positioned higher up within the fluid volume 2 in order to compensate for this. Additionally, the fluid comprises a non-conductive solvent, such as a non-polar solvent, which increases the electrical resistance between the electrodes 6 and 7 and the substrate 13. Furthermore, the initial separation between the first and second electrodes is sufficiently small at the beginning of the process for the preferred current path, that is the path of least resistance, to be between the two electrodes, rather than between the respective electrodes and respective points on the surface of the conductive substrate.

Starting from this arrangement, wherein the structure 10 is formed near the top of the line of fluid, the current example method comprises moving the second electrode 7 away from the first electrode 6 in a manner similar to that of the above described examples. It is also preferable, in the present example, for a fluid composition to be selected such that the height of the deposited line is maximised, so as to maximise the physical separation, and thus the electrical resistance, between the electrodes and the substrate, while maintaining an advantageously narrow fluid line for the purposes of rapid drying and total nanoparticle consumption. Thus, the fluid composition may be selected based upon its fluid properties such as surface tension in order that such taller volumes of liquid may sit upon the substrate surface.

The assembled structure 10 is formed close to the top of the fluid line, and is partially floating in the fluid until the drying process, whereupon it comes into contact with and is adhered to the substrate surface. In this way the present example overcomes the problem of forming straight lines between the electrodes when the substrate is conductive.

Figure 16:
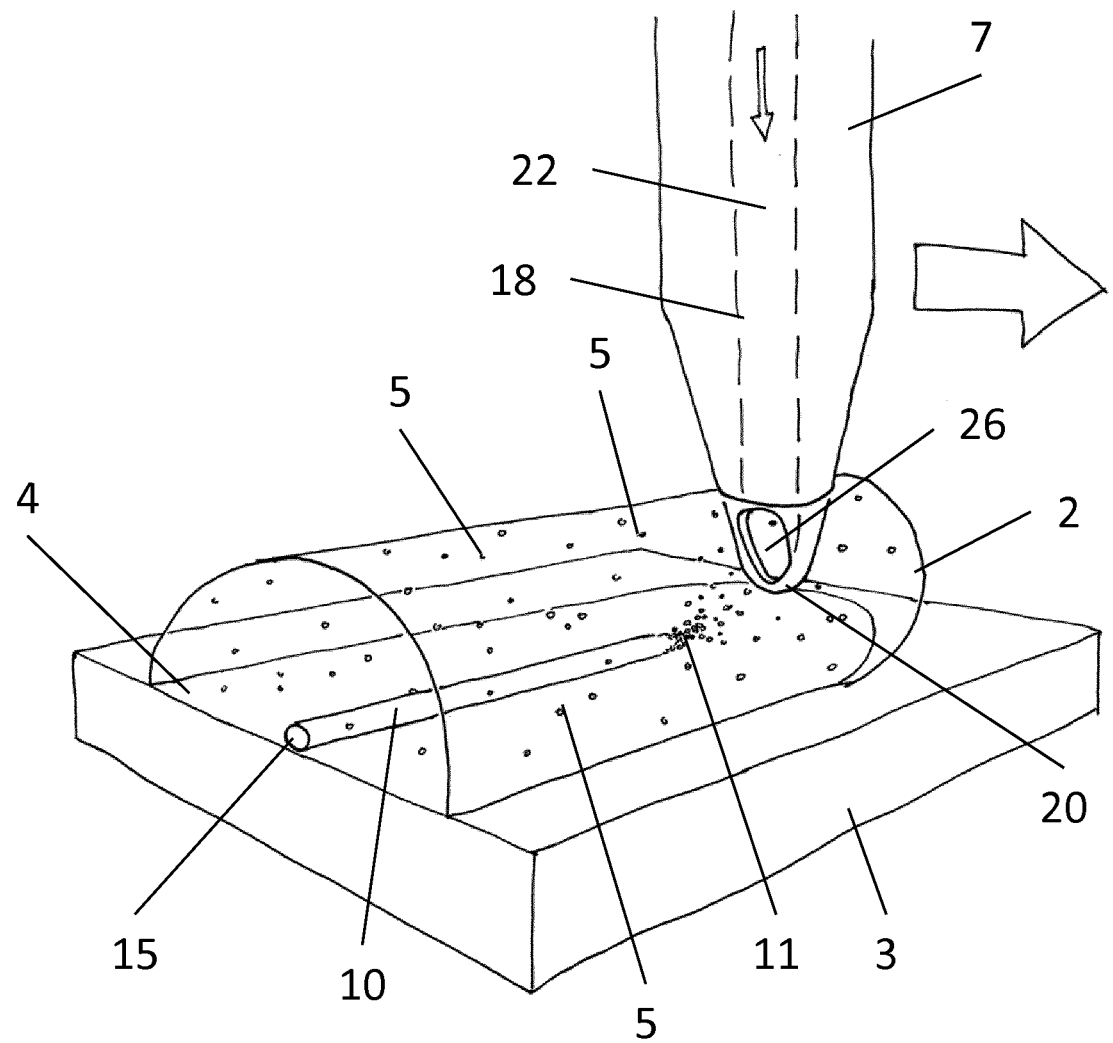
FIG. 16 is a perspective view of a section of an elongate structure being formed upon a section of a substrate in accordance with a seventh example method of the invention.

FIG. 16 illustrates a seventh example method in accordance with the invention, and shows a section of a substrate 3 and a fluid line 2 disposed thereupon over a wetted region 4. The perspective view of FIG. 16 shows an elongate structure 10 being formed by way of moving second electrode 7 along the fluid line. The process depicted may be performed in a similar manner to the first described example, or any method according to the invention wherein an elongate fluid line is used. It will be appreciated that the Figure shows only a section of a substrate upon which the method is being performed, and in particular that the first electrode which is used, together with electrode 7, for applying the alternating electric field is not shown. The Figure illustrates the advantage provided by the invention that is allows the formation of solid line structures upon substrates by way of depositing drops or tracks of fluid onto the substrate and subsequently being able to concentrate nanoparticles within the fluid such the formed line structures are multiples, and even orders of magnitude, more narrow than the fluid volume 2. Furthermore, as is apparent in view of the structure cross-section visible at 15, the cross-section or profile or the formed structure across its width has a height that is comparable to its width. The capability of the method of the invention to form such structures having cross-sectional aspect ratios of approximately one carries the advantage that these structures, when composed of or comprising conductive materials will have increased conductance when compared with narrow structures formed by alternative methods whose cross-sectional profiles may be relatively flat by comparison with the structure illustrated in FIG. 16. The scales at which the widths of the structure 10 and the wetted line 4 on the substrate are illustrated in FIG. 16 are for illustrative purposes only. The actual width of the wetted region 4 may be in the range 1 to 1000 micrometres, for example, and the width of the structure formed within the fluid may be many times more narrow and may, for instance, be as narrow as 200 nanometres, 100 nanometres, 70 nanometres, or less, in width. Therefore, the width and overall size of the structure compared to that of the enveloping fluid volume may be much less than that illustrated in FIG. 16.

FIG. 16 additionally illustrates a further variation for applying the fluid to the substrate in accordance with the method of the invention. The second electrode 7 further comprises, in the seventh example method which is illustrated at FIG. 16, a conduit 18 in the form of a duct or tube within the substantially cylindrical or otherwise elongate electrode. The end part of the second electrode 7 that contacts the fluid 2 and principally applies the electric field to it together with the corresponding part of the first electrode (not shown) comprises an opening 26 connected to the conduit 18. Thus, whereas the previously illustrated examples involve the use of substantially neural-shaped electrodes having pointed ends suitable for producing inhomogeneous electric fields, the second electrode of the presently illustrated example is formed as a hollow needle which is also appropriately shaped for the generation of an optimal electric field shape but further comprises a tube through which fluid can be passed.

As the electrode 7 is moved in the direction indicated by the arrow, along the path defined by the predetermined geometry of the structure 10 to be formed, fluid 22, which contains nanoparticles for forming the structure, is delivered through the conduit 18 in the indicated direction from a fluid source or reservoir (not shown). The fluid 22, which may have a similar or identical composition to that of the fluid 2 already on the substrate, passes through the conduit, out of aperture 26, and is deposited on the substrate 3. In this way, the electrode 7 itself may be used as the sole, or additional, means of delivering the fluid to the substrate to define the wetted region 4. The ability to combine the steps of depositing the fluid ink and applying the electric field so as to conglomerate the particles therein to form the ultra-narrow structure on the substrate is advantageous in that it simplifies the production process and allows it to be performed more quickly compared with techniques requiring separate depositing and electric field application steps.

Delivering the fluid to the substrate via an electrode while the electrode itself is moving along the path which is defining the shape of the formed structure provides the additional advantage that the shape or geometry of the structure to be formed need not be predetermined in the sense that it is determined prior to the application of the electrode field. In this sense, the structure path or geometry is predetermined in each of the examples 1-6, at the time of applying the electric field, since the layout or shape of the wetted region 4 in each of these previous examples is already defined by the fluid ink having being already deposited. Thus, the method for the apparatus shown in FIG. 16 permits elongate structures comprising nanoparticles to be freely drawn or printed, with the shapes of the structures being defined or determined on the fly, while the fluid depositing and structure forming is in progress.

In addition to allowing the formation of ultra-fine structures on substrates whose conductivity varies between that of electrical conductors and electrical insulators, the method of the invention also facilitates the forming of such elongate structures upon substrates having surfaces that are uneven, non-uniform or not flat.

Figure 17:
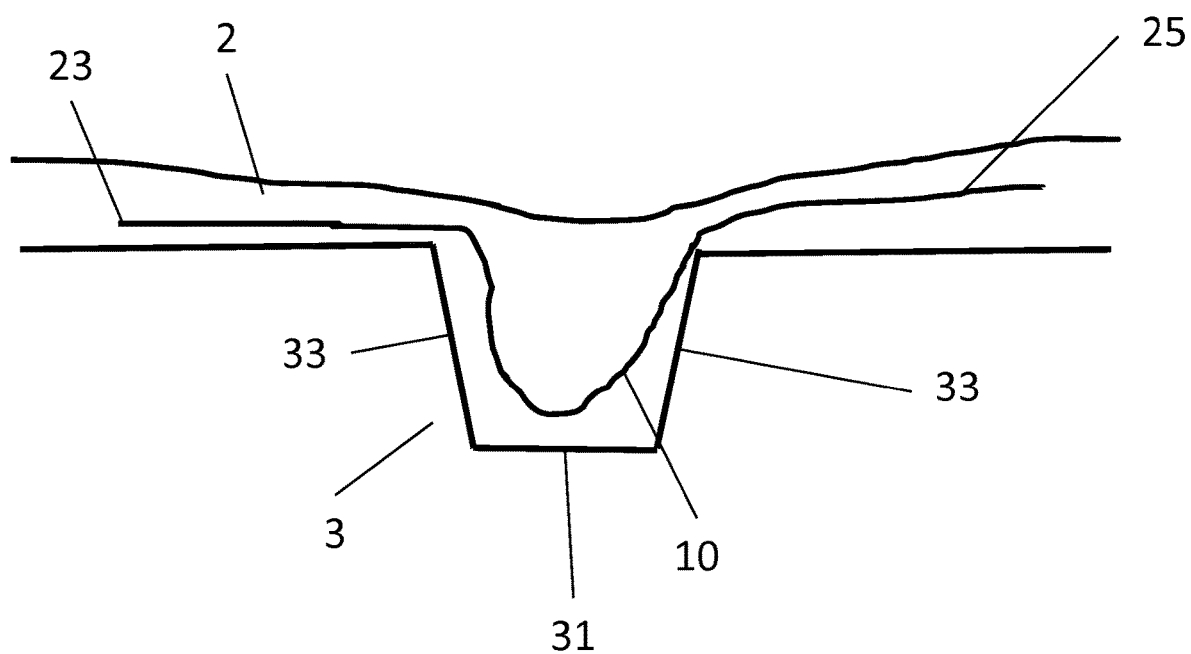
FIG. 17 is a cross section showing the forming of an elongate structure, in accordance with the method of the invention, upon a substrate whose surface comprises a trench with steep side walls.

The way in which this is achieved is illustrated in FIG. 17. Here a cross-section is shown of a substrate 3 upon which a structure is to be formed, wherein the substrate surface comprises at least one trench structure 31 with steep side walls 33. For the purpose of simplicity, the substrate surface is illustrated with a single cavity or trench 33 which has a regular shape comprising straight lines and faces. However, this method may apply to any uneven substrate surface that comprises peaks, troughs, and side walls, or a surface which is not level or has a surface normal whose angle varies across the surface. As can be seen from FIG. 17, the fluid 2, when deposited on the surface, flows such that it is distributed across the trench 31. The surface of the volume of fluid 2 is substantially level, although the fluid extends down into the trench 31. An elongate structure 10 may be formed in a manner similar to those examples described above, such that the structure extends from point 23 to point 25 in a straight line having uniform width, thickness and height. During drying of the fluid, the meniscus of the fluid surface will be lowered into the trench so as to form the downward depression shown in the Figure. The assembled structure, formed in substantially a straight line at some height within the volume of fluid above that of the substrate surface outside of the trench, is lowered as the fluid meniscus dips down into the trench. As the section of the structure 10 that is aligned over the trench changes shape so as to be lowered with the fluid into the trench, the length of the structure at this section increases so as to form a continuous line following a path down the side walls 33 and across the bottom of the trench 31. This process of the structure 10 sinking and stretching is illustrated at an intermediate point in FIG. 17.

In this way, it is possible to form continuous, unbroken ultra-narrow wires in accordance with the invention on substrates having varying depth or roughness profiles.

Figure 18:
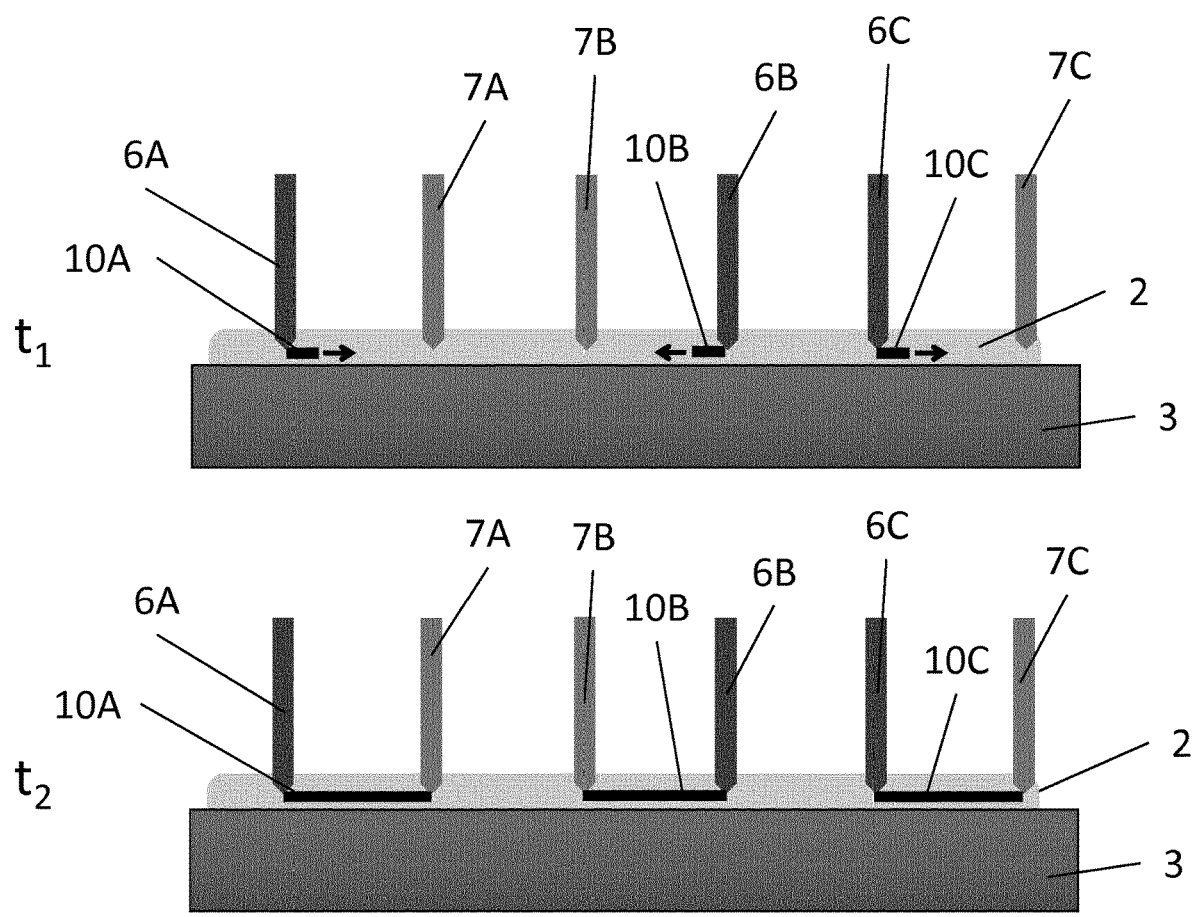
FIGS. 18 and 19 are schematic diagrams illustrating an eighth example method according to the invention.
Figure 19:
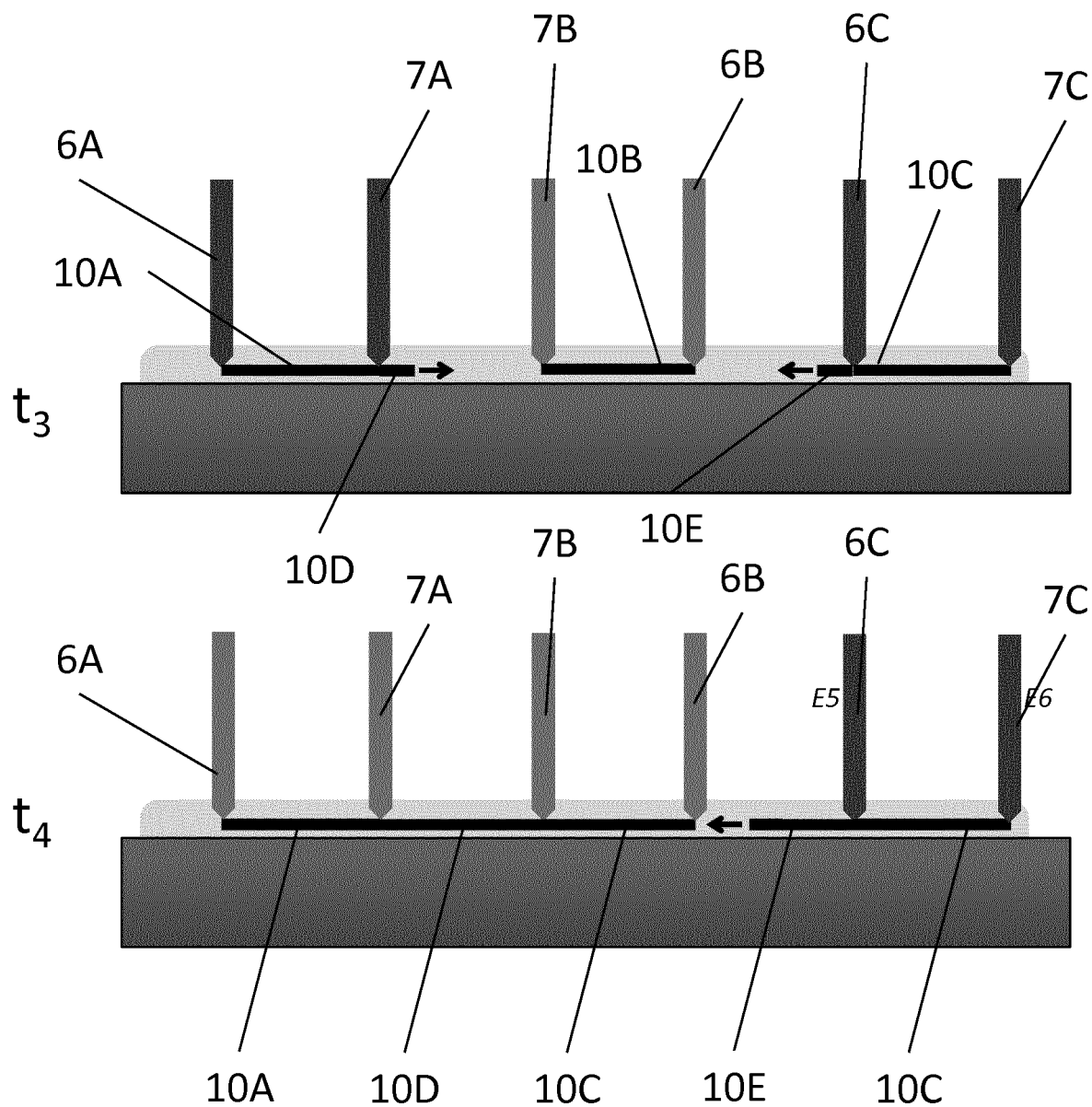

The above discussed issue of the process being adversely affected by structures contacting the electrodes such as in the third example method may be addressed by the technique illustrated in the eighth example method shown in FIGS. 18 and 19. This example comprises a multi-step approach, starting at time $t_1$.

In the first step, a comb-like arrangement of pairs of first 6A-6C and second 7A-7C electrodes are each used to grow a structure 10A-10C extending from each respective first electrode towards the respective second electrode. The electrodes are arranged in separate pairs such that each structure grows towards a different second electrode, rather than having two structures growing from two different first electrodes towards a single shared second electrode, as per the third example.

At time $t_2$, the assembly process has formed each of the elongate structures 10A-10C between each of the electrode pairs.

The electrical polarity of electrodes 7A, 7B and 7C is then switched, as shown in FIG. 19, so that there is no dielectrophoretic force resulting from an electric field felt between pairs of electrodes that are connected via elongate structures.

The second step of the method is then to grow the remainder of the structure between each of those newly formed "first" and "second" electrode pairs, that is 7A and 7B and 6C and 6B, which are effectively created by switching the polarities. The electric field felt within the region of fluid between each of these pairs causes new elongate structures 10D and 10E to be assembled in these regions, and the partially grown state at time $t_3$ is shown in FIG. 19.

In the case that the growth rates of structures 10D and 10E differ, a third step may be carried out, wherein at time $t_4$ the polarity of some electrodes is switched. In the present example, 10D has finished growing at t4, whereas structure 10E extends only part way between electrodes 6B and 6C. In this case, the polarity of each of electrodes 6A and 7A is switched, and the structure 10E continues to grow such that all of the structures are connected and a continuous compound structure is formed.

Otherwise, if instead 10E were to grow towards the second electrode more rapidly than structure 10D, the polarity of the signal applied to 6C and 7C would be changed rather than 6A and 7A.

While this multiple step process may take longer overall to form a long compound structure than the simultaneous growth of the third example, the present example may alleviate the issue of varying structure growth speeds. The point at which the switching of electrode polarity may be necessary can be indicated by monitoring the electrical potential across the electrodes. The short circuit formed when an elongate structure creates electric contact between an electrode pair may cause a significant and detectable drop in electric potential, which may signal that the polarity should be switched in order to continue the growth of the compound structure.

Figure 20:
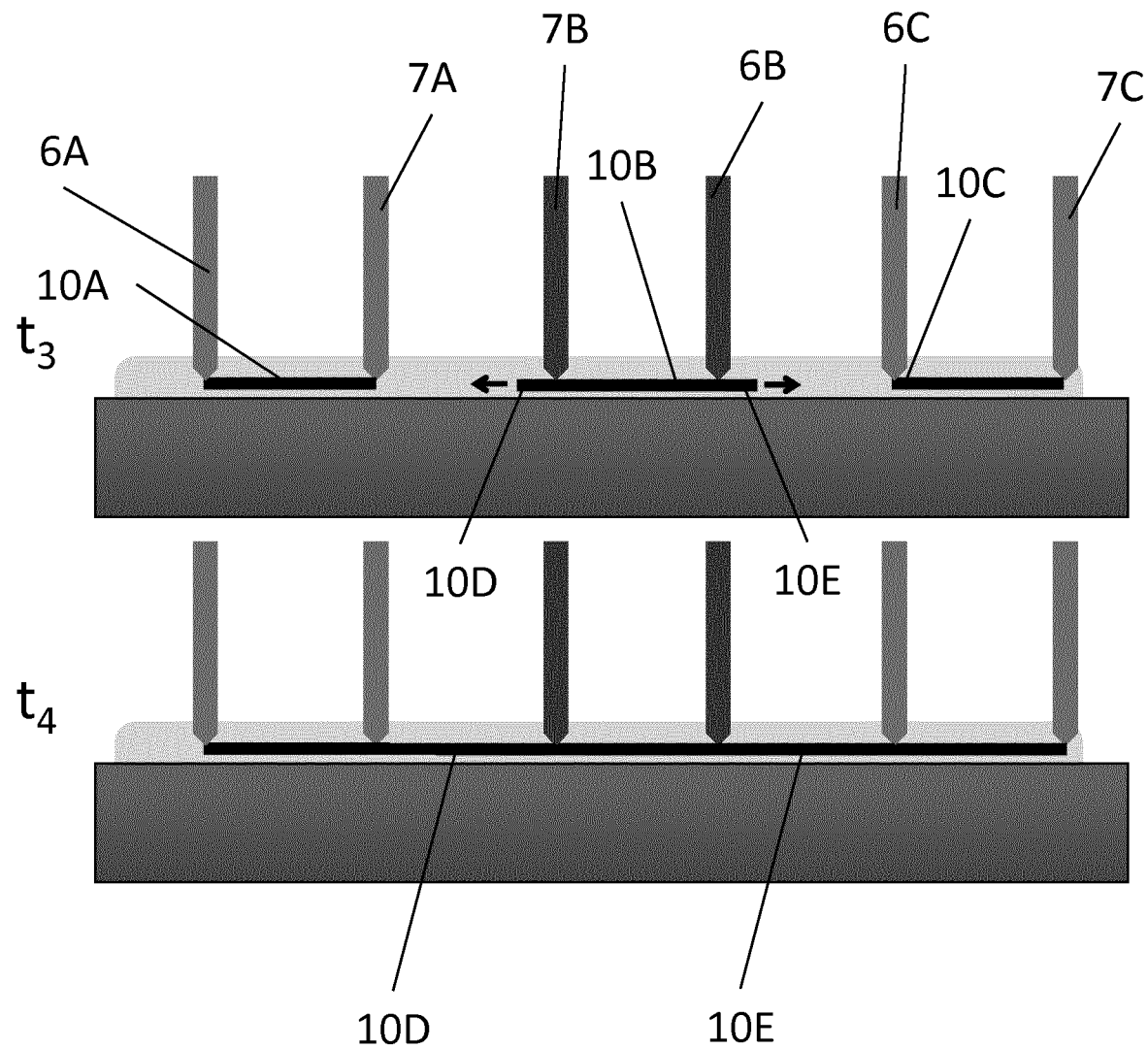
FIG. 20 is a schematic diagram illustrating a ninth example method according to the invention.

A ninth example method is shown in FIG. 20. This method is begun similarly to that of the previous example, as illustrated in FIG. 19, with structures being grown through time $t_1$ to $t_2$.

The present example differs from the previous example in that it is the polarities of electrodes 6A, 7B and 6C which are switched before time $t_3$. This causes structures 10D and 10E to begin growing in the opposite direction to the previous example, from now both "first" electrodes 7B and 6B towards now both "second" electrodes 7A and 6C, respectively.

At time $t_4$ a continuous compound structure has been formed by way of structures 10D and 10E interconnecting structures 10A, 10B and 10C. A third step, as described above, is required in the present configuration if more than six electrodes are used.

Figure 21:
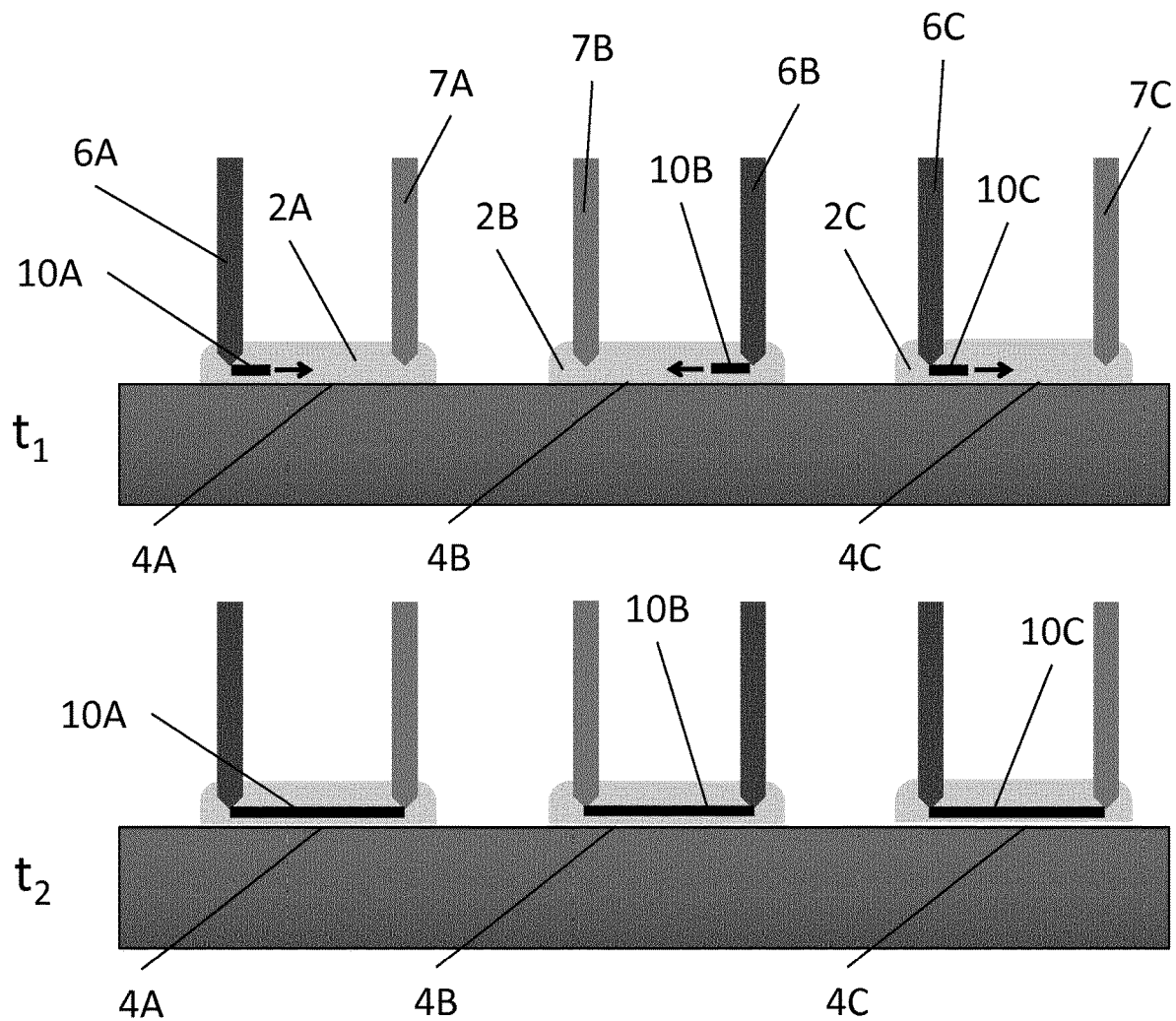
FIGS. 21 and 22 are schematic diagrams illustrating a tenth example method according to the invention.
Figure 22:
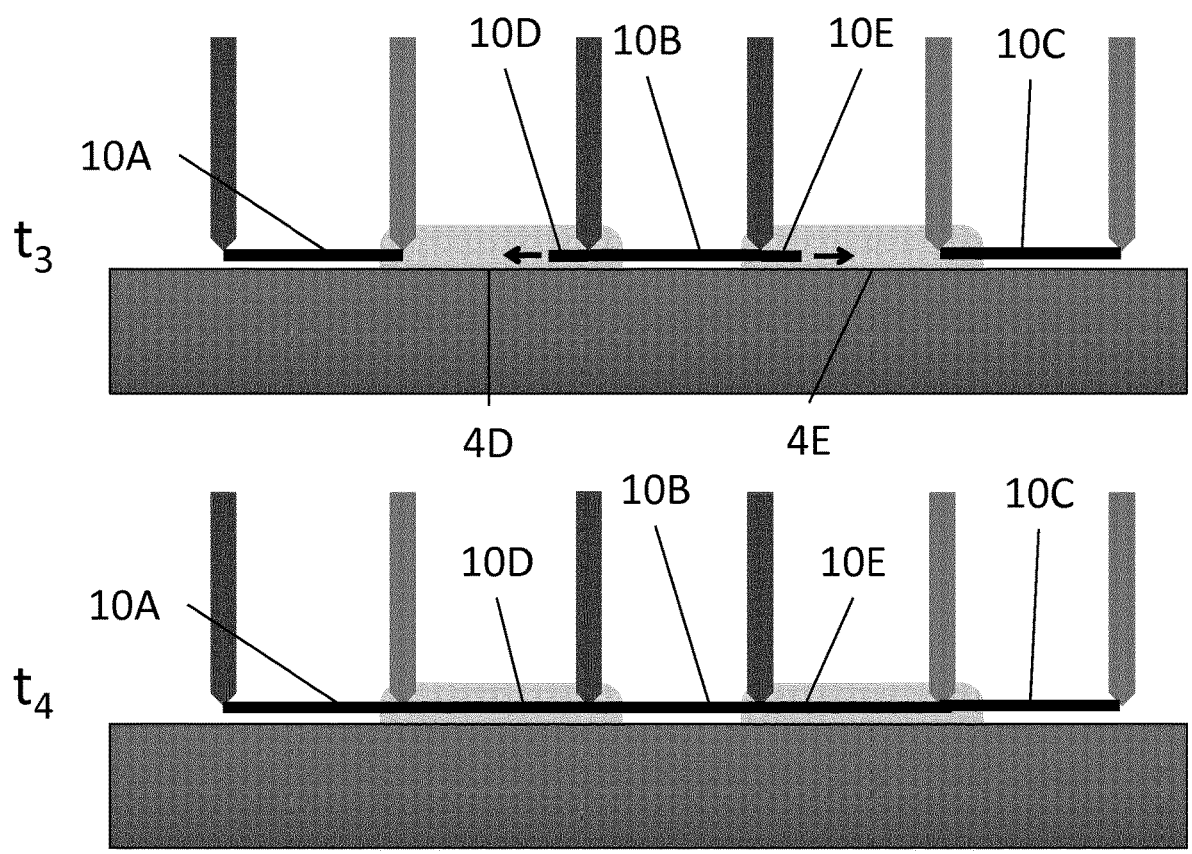

A tenth example method is shown in FIGS. 21 and 22 and uses the same polarity switching principle of the previous examples to form a long compound structure with multiple pairs of electrodes. This example likewise uses a comb-like array of electrode pairs, and differs in that, rather than forming elongate structures within a single, continuous volume or line of fluid on a single wetted region, the electrode pairs each apply an electric field to an individual volume of fluid 2A-2C on a separate wetted region 4A-4C respectively. Through time $t_1$ to $t_2$ elongate structures 10A-10C are formed within these three selectively wetted regions on the substrate.

The fluid is then removed from regions 4A-4C, leaving dried structures 10A-10C, Fluid is then selectively deposited upon the substrate to define wetted regions 4D and 4E and the polarity of the signal applied to some of the electrodes is switched such that nanoparticles within the newly deposited fluid volumes begin to assemble into elongate structures growing from electrodes 7B and 6B.

As shown FIG. 22, through time $t_3$ to $t_4$ these new structures 10D and 10E are assembled by the dielectrophoretic forces resulting from the signal applied across electrodes pairs 7B and 7A and 6B and 6C such that they extend towards and eventually reach electrodes 7A and 6C. Thus at $t_4$ an single, long compound elongate structure has been formed, and the selectively wetted regions 4D and 4E may then be dried so as to stabilise and adhere to the substrate the remaining wetted sections 10D and 10E of this compound structure. This selective staged wetting technique provides a more controllable, industrially scalable approach to forming compound structures using an array of electrode pairs.

Figure 23:
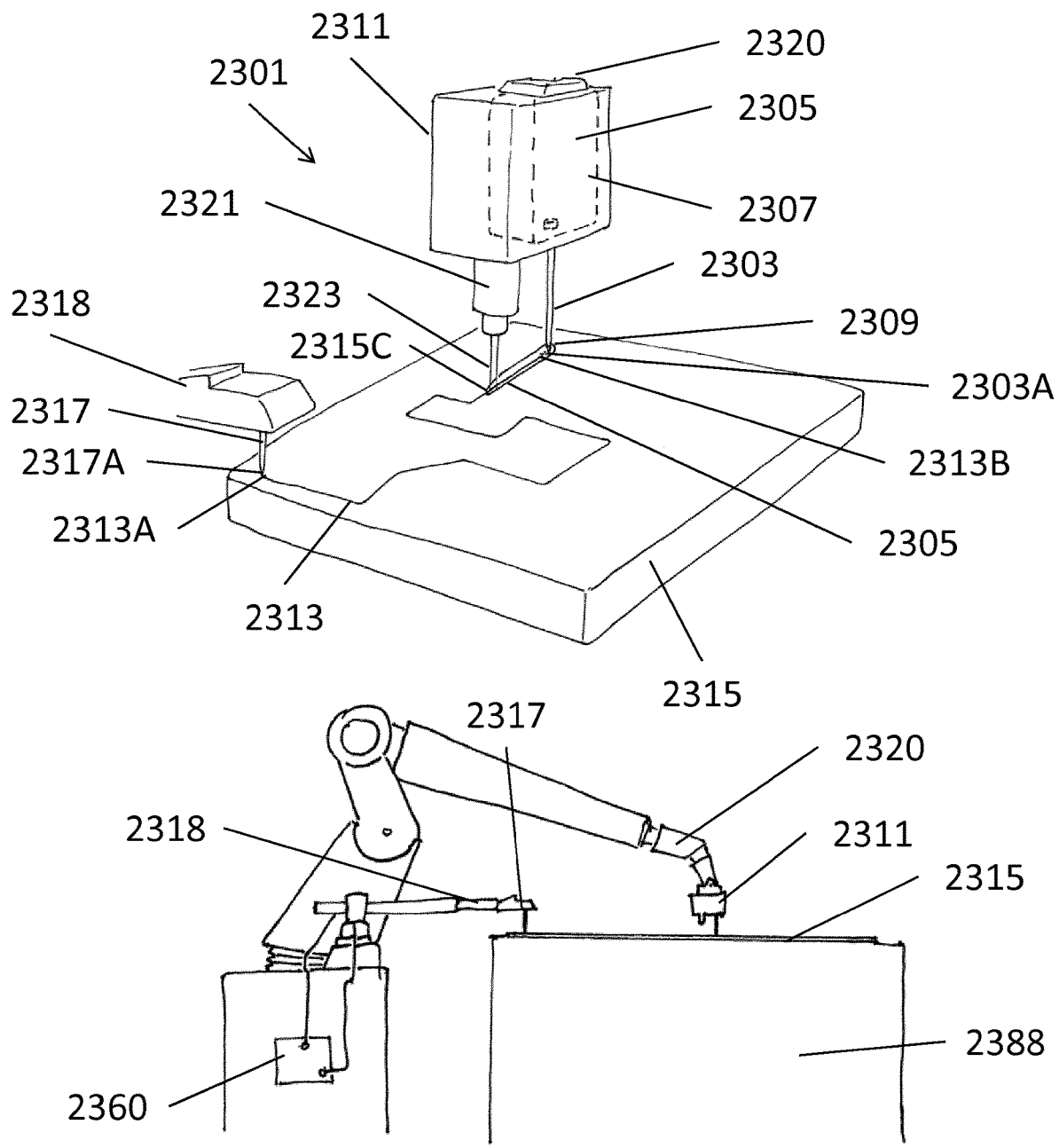
FIG. 23 shows an example apparatus according to the invention in perspective and side views.

With reference to FIG. 23, an example apparatus according to the invention is now described. The apparatus 2301 includes an elongate electrode 2303 formed as a needle containing a duct (not shown) through which nanoparticle-containing fluid ink 2305 may be delivered from reservoir 2307 located in the print head 2311 (to which electrode 2303 is attached), via a nozzle 2309.

The figure shows the apparatus 2301 during the process of forming an elongate structure 2313 upon a substrate 2315. The structure 2313 is formed along a path running between a point at which static electrode 2317 (corresponding to the "first electrode" of the present claimed invention) is proximal to the substrate 2315. The pointed end 2317A of the static electrode is connected to a first end 2313A of the elongate structure 2313 by virtue of the assembly of the structure 2313 having begun with the initial accumulation of nanoparticles within the ink 2305 at point 2317A owing to the electric field intensity at this point. The shape, that is the printed pattern, of the structure depicted is arbitrary and for illustrative purposes only.

Non-moving electrode 2317 is held by a support 2318 and so remains static during the printing of a particular given structure 2313. In this way, the contact between electrode 2317 and structure 2313 allows the current signal applied between electrodes 2317 and 2303 to propagate through structure 2313 so as to result in a dielectrophoresis-inducing force in the region between the second end (that is the "growing", "extending" end) 2313B of the elongate structure and the tip of the moving electrode 2303A. The support 2318 is also movable so that the static electrode tip 2317A can be repositioned at different starting points upon a substrate 2315 so as to be able to form multiple elongate structures 2313.

As shown in the side view of FIG. 23, the first and second electrodes 2317 and 2303 are held on robotic actuators 2319 and 2320, respectively. These are shown for illustrative purposes only in their depicted form, and may comprise any movable support or actuator capable of moving the second electrode 2303 along the printing path and holding the first electrode 2317 in place during each printing run. A printing run may be understood as a procedure of printing a given structure.

The apparatus may also comprise a heater (not shown) disposed within or under the support 2388 upon which substrate 2315 sits. This can provide under-substrate heating so as to speed up fluid evaporation.

As shown in the perspective view, the print head further comprises a laser 2321 positioned so as to direct a heating laser beam 2323 at a point 2315C upon the substrate. This point moves along the path traced out by the second electrode 2303 as it prints structure 2313 so as to heat the fluid 2305 shortly after the nanoparticles within it have been assembled at that point. As can be seen in this figure, the deposited fluid 2305 upon the substrate extends substantially only between the electrode 2303 and the drying point 2315C, since, at the stage depicted in the figure, all points along the elongate structure 2313 between the starting point 2313A and the drying point 2315C have already been subjected to heating by the laser 2321.

The apparatus can optionally comprise an LED light source (not shown) configured to illuminate at least the portion of the structure between the two electrodes with radiation having an appropriate wavelength for inducing conductivity in the structure when necessary.

Figure 24:
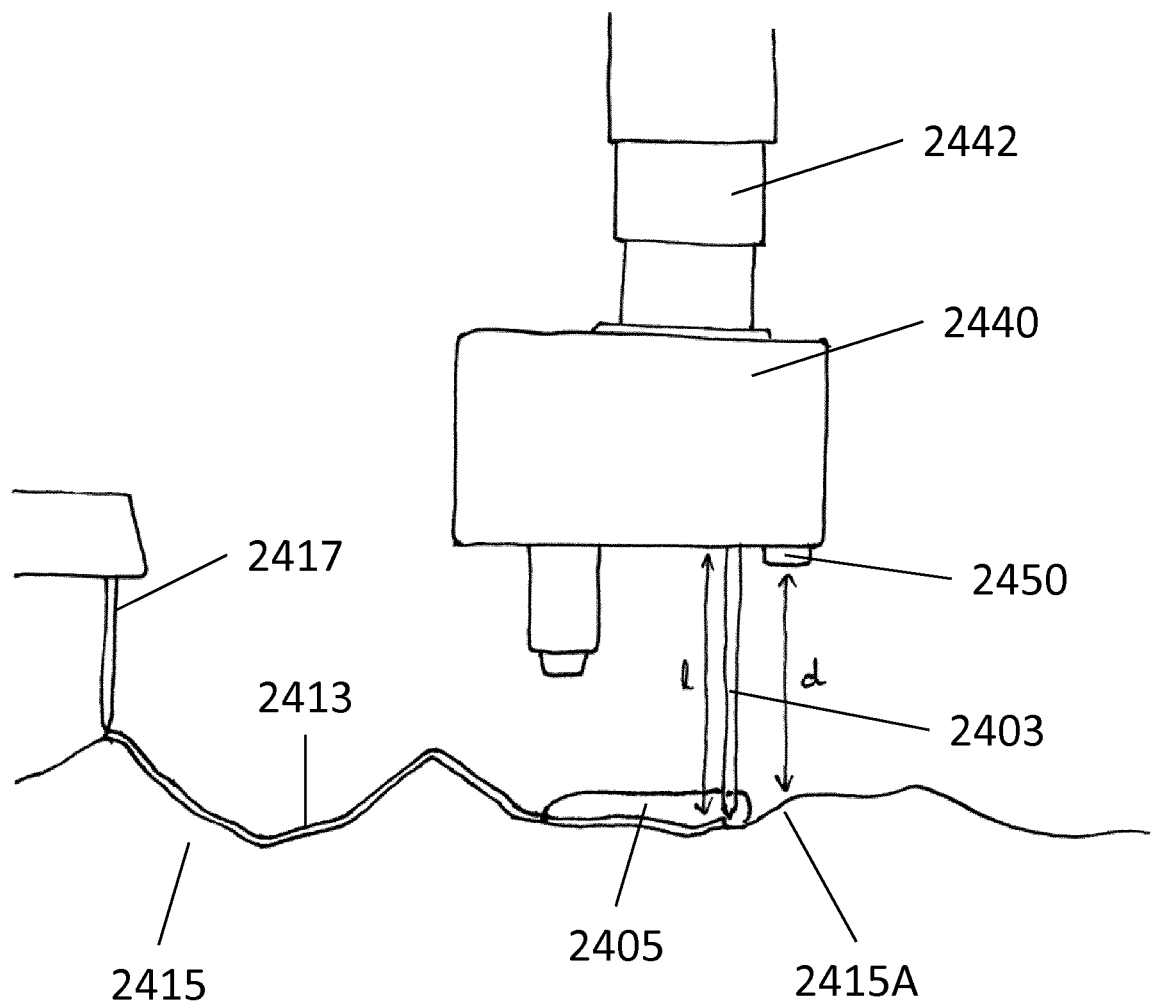
FIG. 24 shows a further example apparatus according to the invention in side view.

With reference to FIG. 24, part of a further example apparatus according to the invention is shown. In the depicted example, an elongate structure 2413 is being assembled upon a substrate 2415 having an uneven surface comprising inclined regions. As per the previous example, the structure 2413 is formed between static first electrode 2417 and moving second electrode 2403. The second electrode 2403 is again attached to the print head 2440, which is held upon a telescopic actuator 2442. This actuator is capable of raising and lowering the print head 2440 so as to accommodate the differing height of the surface of the substrate 2415 and account for the undulations while printing. This is achieved using distance sensor 2450 in the form of a Michelson interferometer upon the print head 2440. The sensor can monitor the distance d denoted by the figure between the sensor and the region of the substrate 2415 that is vertically below it 2415A. Together with a known length I of electrode 2403, the vertical distance between the tip of this electrode and the region 2415A of the substrate 2415 which the electrode 2403 will imminently reach during the printing run may be calculated. Using this, a controller such as that indicated at 2360 in FIG. 23 may utilise this data so as to adjust the height of the print head 2440 using telescopic actuator 2442 in order to ensure that the tip of the print head electrode 2403 is raised or lowered to the appropriate height in accordance with the monitored height of the oncoming point 2415A of the substrate 2415. In each of these figures, the relative scales may have been altered for illustrative purposes. For instance, in FIG. 24, the height of the structure relative to that of the fluid volume 2405 is exaggerated.

Figure 25:
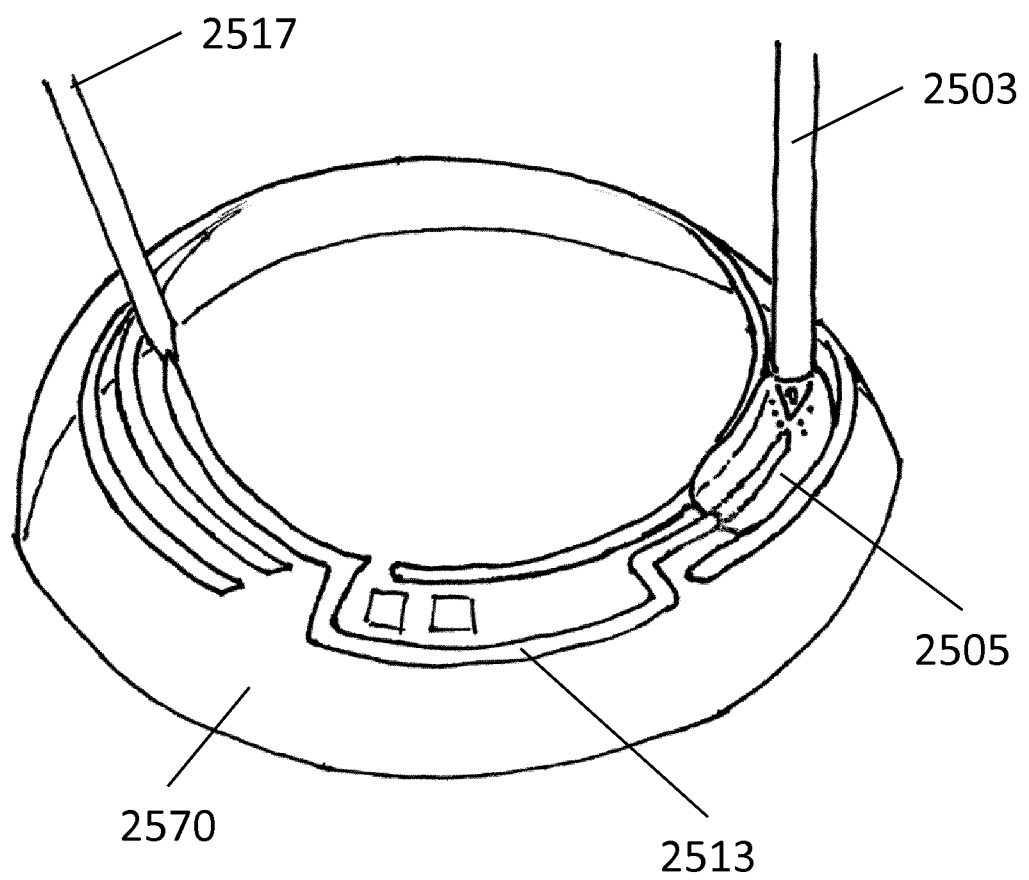
FIG. 25 is a perspective view showing an example application of the apparatus and method according to the invention.

An example application of this height-adjustable nanowire printing apparatus is shown in FIG. 25. In this example, a contact lens 2570, which has a curved shape, is used as a substrate upon which an elongate structure 2513 is printed. Static electrode 2517 is positioned at the start point of the structure, while second electrode 2503 is moved by the print head (not shown) across the curved surface of the contact lens 2570 while depositing fluid ink 2505. Advantageously, since the printing height is adjusted so as to conform the path of the tip of electrode 2503 to the contours of a contact lens 2570, ultrafine structures may be printed on the surface of objects such as contact lenses using this apparatus and method.

The invention claimed is:

1. A method for forming structures upon a substrate, the method comprising:
    depositing fluid onto a substrate so as to define a wetted region, the fluid containing electrically polarizable nanoparticles;
    applying an alternating electric field to the fluid on the wetted region, using a first electrode and a second electrode, so that a plurality of the nanoparticles are assembled to form an elongate structure extending from the first electrode towards the second electrode, wherein the electric field is applied such that a dielectrophoretic force is exerted upon the plurality of nanoparticles and causes mobile nanoparticles within the fluid to be attracted via the dielectrophoretic force to the elongate structure; and
    removing the fluid such that the elongate structure remains upon the substrate,
    further comprising, during the step of applying the alternating electric field, increasing separation between the first and second electrodes by moving the second electrode away from the first electrode so as to further extend the elongate structure towards the second electrode by way of the addition, via the dielectrophoretic force, of nanoparticles to an end of the structure at an assembly region proximal to the moving electrode;
    wherein at least one of the electrodes has an elongate shape comprising a pointed end, and wherein applying an alternating electric field to the fluid comprises bringing the pointed end into contact with the fluid.

2. The method according to claim 1, wherein the relationship between the rate at which the length of the elongate structure is increased and the rate at which the separation between the first and second electrodes is increased causes the separation between an end part of the structure and an electrode to be such that the electric field in a region of the fluid proximal to the electrode and the end part of the structure causes mobile nanoparticles in that region to assemble upon the end part of the structure.

3. The method according to claim 1, further comprising monitoring the rate at which the length of the elongate structure is increasing; and
    adjusting the properties of the alternating electric field in accordance with the monitored rate, such that the length of the elongate structure is increased at a predetermined rate.

4. The method according to claim 1, wherein the electric field has a DC bias, and wherein the DC bias is such that a first end of the structure is formed by mobile nanoparticles within the fluid attaching to the first electrode.

5. The method according to claim 1, wherein the first electrode or the second electrode comprises a conduit, and wherein the fluid is deposited onto the substrate via the conduit.

6. The method according claim 1, wherein the first and second electrodes are connected to a controller configured to control an alternating electric current between the electrodes such that the current has an AC amplitude in the range 1-10,000 µA and a DC bias in the range 0.1-1,000 µA.

7. The method according to claim 6, wherein the controller is configured to control the alternating electric current such that the AC amplitude is in the range 10-1,000 µA and the DC bias is in the range 1-100 µA.

8. The method according claim 1, comprising moving the second electrode along a predetermined path corresponding to the shape of the wetted region on the substrate, thereby assembling the structure such that the structure extends along the predetermined path from a first end position to a second end position within the wetted region.

9. The method according claim 1, wherein the step of applying the electric field is repeated for fluid deposited on a second wetted region on the substrate, so as to form a second structure, wherein the second structure extends from a first end position within the second region to a second end position within the second wetted region, and wherein either of the first or second end positions of the second wetted region coincides with the structure formed on the wetted region.

10. The method according claim 1, wherein the method further comprises a sintering process, wherein the sintering process causes assembled nanoparticles to coalesce so as to increase the firmness of the elongate structure.

11. A method for forming structures upon a substrate, the method comprising:
    depositing fluid onto a substrate so as to define a wetted region, the fluid containing electrically polarizable nanoparticles;
    applying an alternating electric field to the fluid on the wetted region, using a first electrode and a second electrode, so that a plurality of the nanoparticles are assembled to form an elongate structure extending from the first electrode towards the second electrode, wherein the electric field is applied such that a dielectrophoretic force is exerted upon the plurality of nanoparticles and causes mobile nanoparticles within the fluid to be attracted via the dielectrophoretic force to the elongate structure; and
    removing the fluid such that the elongate structure remains upon the substrate, further comprising, during the step of applying the alternating electric field, increasing separation between the first and second electrodes by moving the second electrode away from the first electrode so as to further extend the elongate structure towards the second electrode by way of the addition, via the dielectrophoretic force, of nanoparticles to an end of the structure at an assembly region proximal to the moving electrode;
wherein the first electrode or the second electrode comprises a conduit, and wherein the fluid is deposited onto the substrate via the conduit.

12. The method according to claim 11, wherein the relationship between the rate at which the length of the elongate structure is increased and the rate at which the separation between the first and second electrodes is increased causes the separation between an end part of the structure and an electrode to be such that the electric field in a region of the fluid proximal to the electrode and the end part of the structure causes mobile nanoparticles in that region to assemble upon the end part of the structure.

13. The method according to claim 11, further comprising monitoring the rate at which the length of the elongate structure is increasing; and
adjusting the properties of the alternating electric field in accordance with the monitored rate, such that the length of the elongate structure is increased at a predetermined rate.

14. The method according to claim 11, wherein the electric field has a DC bias, and wherein the DC bias is such that a first end of the structure is formed by mobile nanoparticles within the fluid attaching to the first electrode.

15. The method according claim 11, wherein the first and second electrodes are connected to a controller configured to control an alternating electric current between the electrodes such that the current has an AC amplitude in the range 1-10,000 μA and a DC bias in the range 0.1-1,000 μA.

16. The method according claim 11, wherein the method further comprises a sintering process, wherein the sintering process causes assembled nanoparticles to coalesce so as to increase the firmness of the elongate structure.

17. A method for forming structures upon a substrate, the method comprising:
depositing fluid onto a substrate so as to define a wetted region, the fluid containing electrically polarizable nanoparticles;
applying an alternating electric field to the fluid on the wetted region, using a first electrode and a second electrode, so that a plurality of the nanoparticles are assembled to form an elongate structure extending from the first electrode towards the second electrode, wherein the electric field is applied such that a dielectrophoretic force is exerted upon the plurality of nanoparticles and causes mobile nanoparticles within the fluid to be attracted via the dielectrophoretic force to the elongate structure;
removing the fluid such that the elongate structure remains upon the substrate, further comprising, during the step of applying the alternating electric field, increasing separation between the first and second electrodes by moving the second electrode away from the first electrode so as to further extend the elongate structure towards the second electrode by way of the addition, via the dielectrophoretic force, of nanoparticles to an end of the structure at an assembly region proximal to the moving electrode; and
moving the second electrode along a predetermined path corresponding to the shape of the wetted region on the substrate, thereby assembling the structure such that the structure extends along the predetermined path from a first end position to a second end position within the wetted region.

18. The method according claim 17, wherein the step of applying the electric field is repeated for fluid deposited on a second wetted region on the substrate, so as to form a second structure, wherein the second structure extends from a first end position within the second region to a second end position within the second wetted region, and wherein either of the first or second end positions of the second wetted region coincides with the structure formed on the wetted region.

19. The method according to claim 17, wherein the relationship between the rate at which the length of the elongate structure is increased and the rate at which the separation between the first and second electrodes is increased causes the separation between an end part of the structure and an electrode to be such that the electric field in a region of the fluid proximal to the electrode and the end part of the structure causes mobile nanoparticles in that region to assemble upon the end part of the structure.

20. The method according to claim 17, further comprising monitoring the rate at which the length of the elongate structure is increasing; and
adjusting the properties of the alternating electric field in accordance with the monitored rate, such that the length of the elongate structure is increased at a predetermined rate.

* * * * *